(12) United States Patent
Saito et al.

(10) Patent No.: US 6,995,962 B2
(45) Date of Patent: Feb. 7, 2006

(54) FERROMAGNETIC DOUBLE TUNNEL JUNCTION ELEMENT WITH ASYMMETRIC ENERGY BAND

(75) Inventors: Yoshiaki Saito, Kawasaki (JP); Masayuki Sagoi, Yokohama (JP); Minoru Amano, Kawasaki (JP); Kentaro Nakajima, Tokyo (JP); Shigeki Takahashi, Yokohama (JP); Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/968,336

(22) Filed: Oct. 20, 2004

(65) Prior Publication Data

US 2005/0078418 A1    Apr. 14, 2005

Related U.S. Application Data

(62) Division of application No. 10/093,390, filed on Mar. 11, 2002, now Pat. No. 6,839,206.

(30) Foreign Application Priority Data

Mar. 12, 2001    (JP)    ............................. 2001-068741

(51) Int. Cl.
*G11B 5/39* (2006.01)
(52) U.S. Cl. .................................................. 360/324.2
(58) Field of Classification Search ............. 360/324.2
See application file for complete search history.

(56) References Cited

U.S. PATENT DOCUMENTS

| 5,986,858 | A | * | 11/1999 | Sato et al. ................ 360/324.2 |
|---|---|---|---|---|
| 6,210,818 | B1 | | 4/2001 | Saito ........................ 428/811.2 |
| 6,259,586 | B1 | * | 7/2001 | Gill ......................... 360/324.2 |
| 6,473,275 | B1 | * | 10/2002 | Gill ............................ 360/314 |
| 6,483,676 | B2 | | 11/2002 | Nakatani .................. 360/324.2 |
| 6,535,364 | B1 | | 3/2003 | Kumagai et al. ......... 360/324.2 |
| 6,535,365 | B1 | | 3/2003 | Lukaszew et al. ....... 360/324.2 |
| 6,611,405 | B1 | | 8/2003 | Inomata et al. .......... 360/324.2 |
| 6,646,835 | B2 | | 11/2003 | Saito et al. ............ 360/324.11 |
| 6,650,509 | B2 | | 11/2003 | Gill ............................ 360/314 |
| 6,657,823 | B2 | | 12/2003 | Kawato ...................... 360/314 |
| 6,760,201 | B2 | * | 7/2004 | Nakashio et al. ......... 360/324.2 |
| 6,819,530 | B2 | * | 11/2004 | Gill ............................ 360/314 |
| 2002/0044396 | A1 | * | 4/2002 | Amano et al. ........... 360/324.2 |
| 2004/0100817 | A1 | * | 5/2004 | Subramanian .............. 365/158 |

FOREIGN PATENT DOCUMENTS

JP    9-260743    10/1997

(Continued)

OTHER PUBLICATIONS

Jagadeesh S. Moodera, et al., "Ferromagnetic-Insulator-Ferromagnetic Tunneling: Spin-Dependent Tunneling and Large Magnetoresistance in Trilayer Junctions (Invited)", Symposium on Spin Tunneling and Injection Phenomena, American Institute of Physics, vol. 79, No. 8, Apr. 15, 1996, pp. 4724-4729.

(Continued)

*Primary Examiner*—Jefferson Evans
(74) *Attorney, Agent, or Firm*—Oblon, Spivak, McClelland, Maier & Neustadt, P.C.

(57) ABSTRACT

There is provided a magnetoresistance effect element including a first pinned ferromagnetic layer, a second pinned ferromagnetic layer facing the first pinned ferromagnetic layer, surface regions of the first and second pinned ferromagnetic layer facing each other being different from each other in composition, a free ferromagnetic layer intervening between the first and second pinned ferromagnetic layers, a first tunnel barrier layer intervening between the first pinned ferromagnetic layer and the free ferromagnetic layer, and a second tunnel barrier layer intervening between the second pinned ferromagnetic layer and the free ferromagnetic layer.

24 Claims, 12 Drawing Sheets

FOREIGN PATENT DOCUMENTS

| | | |
|---|---|---|
| JP | 10-4227 | 1/1998 |
| JP | 2000-20922 | 1/2000 |
| JP | 2000-215422 | 8/2000 |
| JP | 2000-251230 | 9/2000 |
| JP | 2002-520873 | 7/2002 |
| JP | 2003-531476 | 10/2003 |

OTHER PUBLICATIONS

J.S. Moodera, et al., "Large Magnetoresistance at Room Temperature in Ferromagnetic Thin Film Tunnel Junctions", Physical Review Letters, vol. 74, No. 16, Apr. 1995, pp. 3273-3276.

L.F. Schelp, et al., "Spin-Dependent Tunneling with Coulomb Blockade", Rapid Communication, The American Physical Society, Physical Review B, vol. 56, No. 10, Sep. 1, 1997, pp. R5747-R5750.

Y. Saito et al., "Spin Dependent Tunneling Through Layered Hard-Magnetic Nano-Particles", J. Magnetic Soc., vol. 23, No. 4-2, 1999, pp. 1269-1272.

F. Montaigne, et al., "Enhanced Tunnel Magnetoresistance at High Bias Voltage in Double-Barrier Planar Junctions", Applied Physics Letters, vol. 73, No. 19, Nov. 1998, pp. 2829-2831.

* cited by examiner

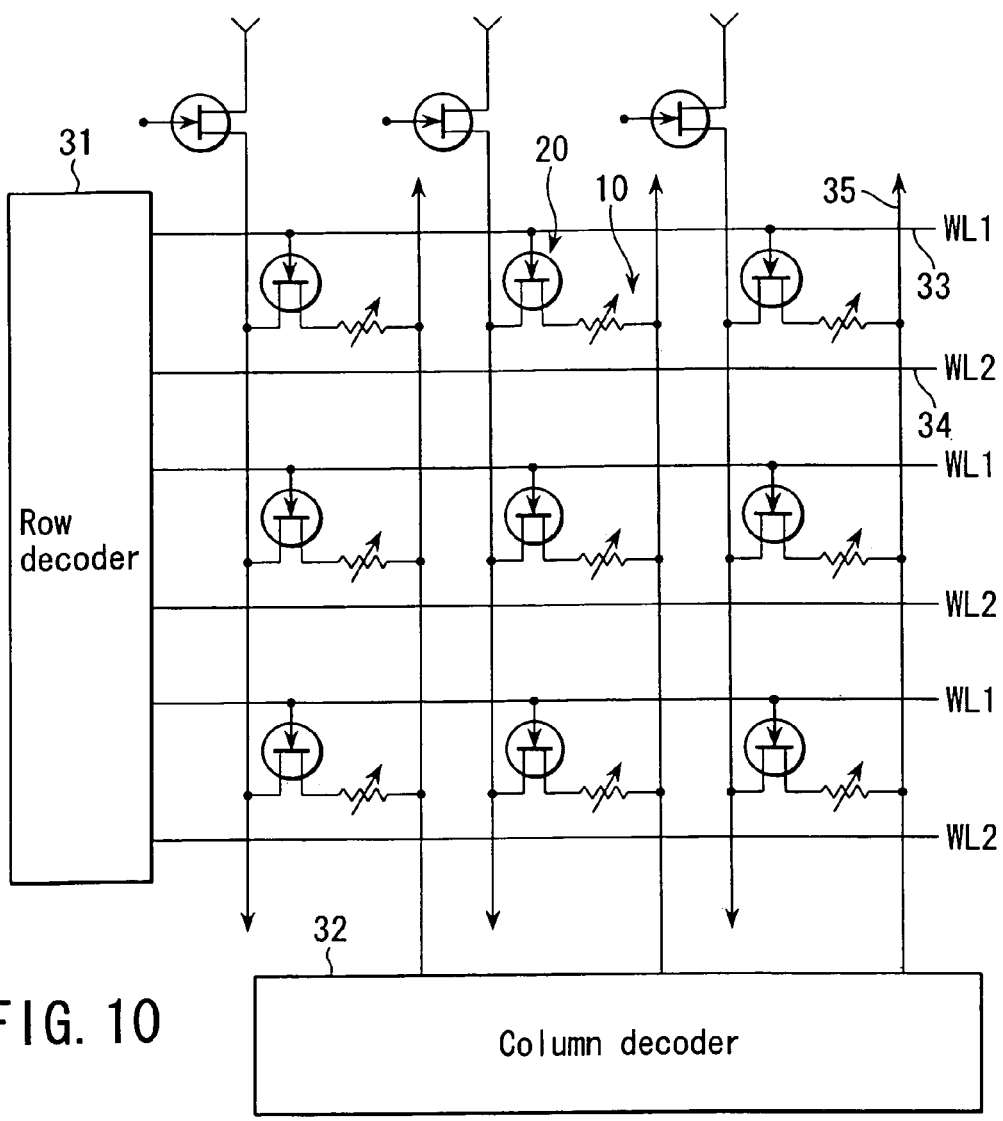
FIG. 10
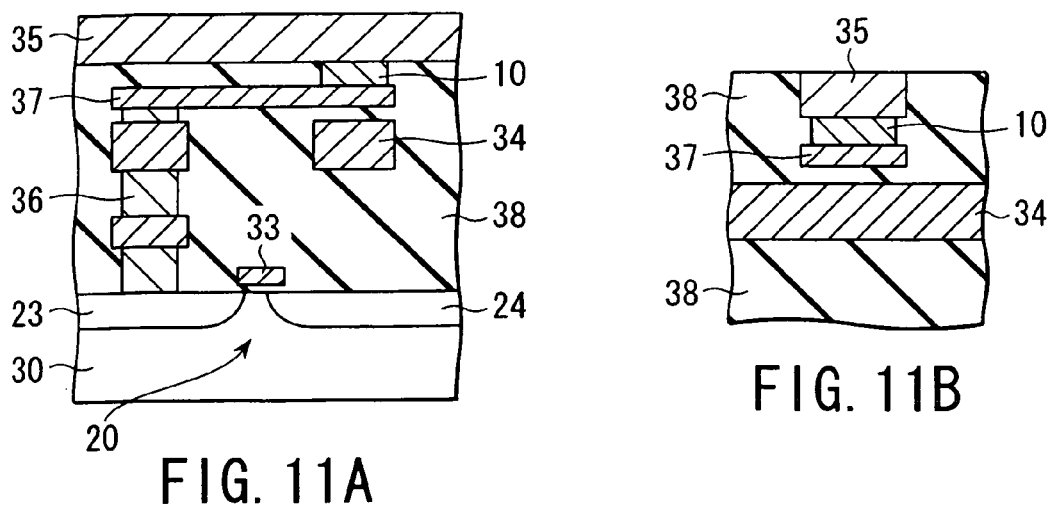
FIG. 11A
FIG. 11B

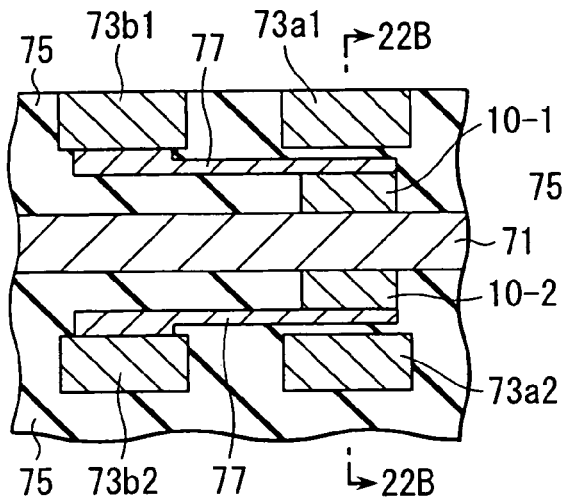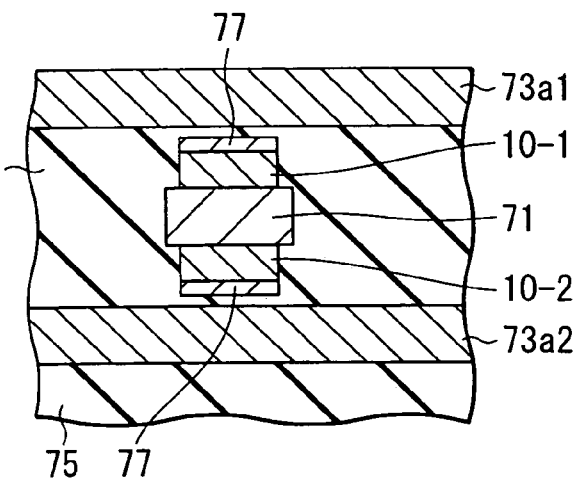
FIG. 22A  FIG. 22B
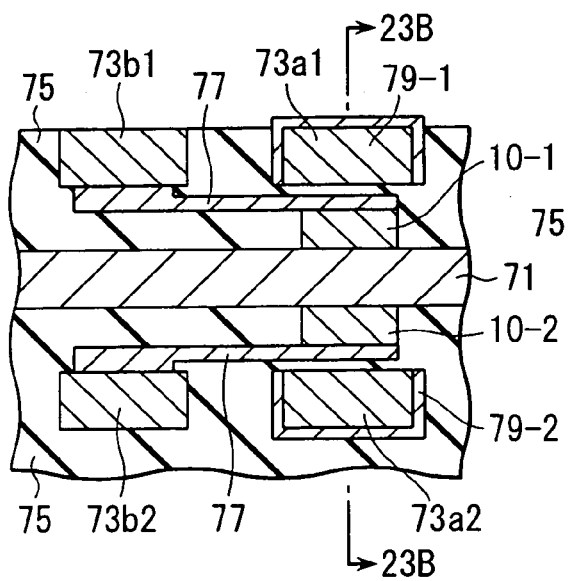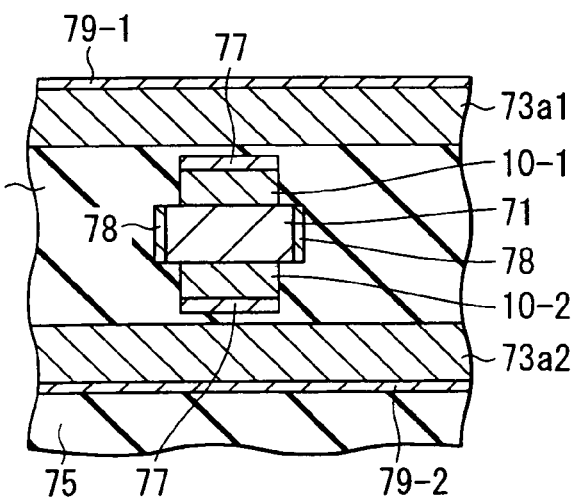
FIG. 23A  FIG. 23B

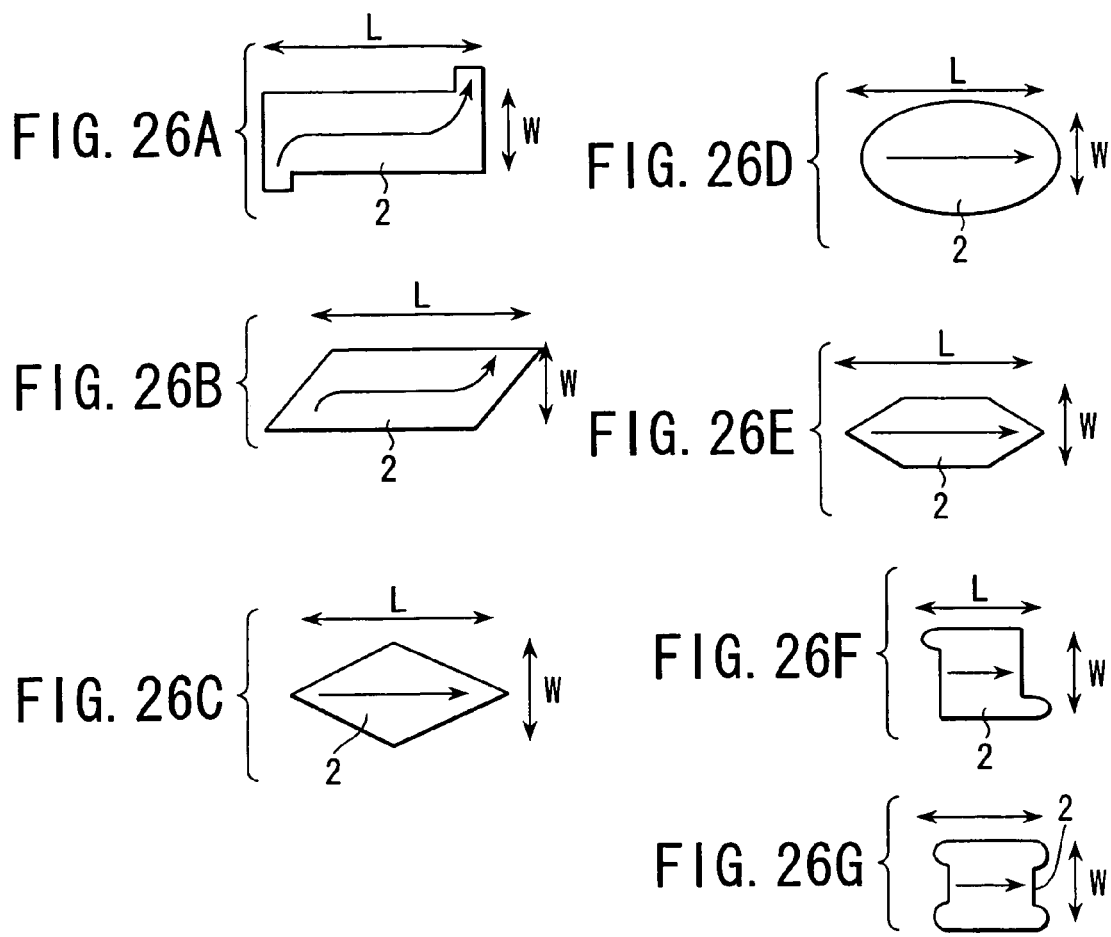
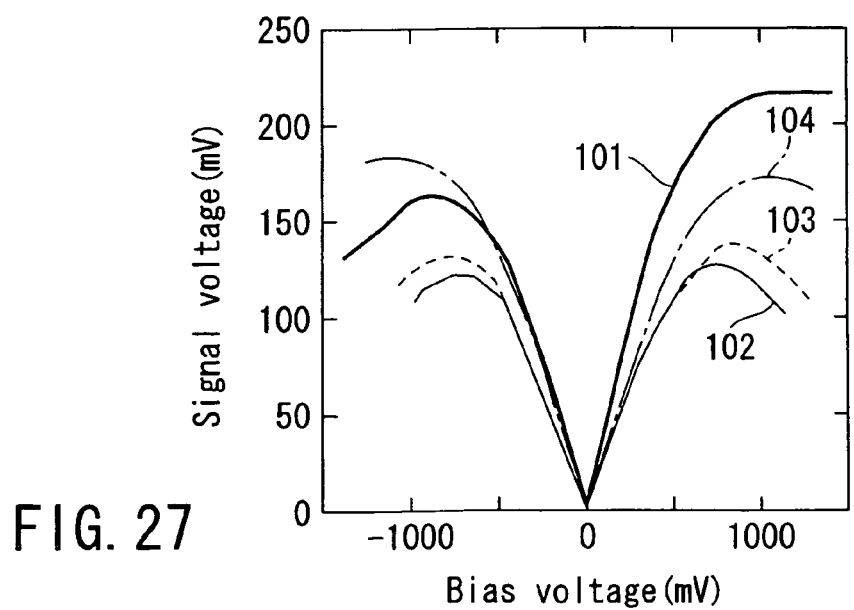
FIG. 27

FERROMAGNETIC DOUBLE TUNNEL JUNCTION ELEMENT WITH ASYMMETRIC ENERGY BAND

CROSS-REFERENCE TO RELATED APPLICATIONS

This application is a divisional application of U.S. application Ser. No. 10/093,390, filed Mar. 11, 2002 now U.S. Pat. No. 6839206, and further is based upon and claims the benefit of priority from the prior Japanese Patent Application No. 2001-068741, filed Mar. 12, 2001, the entire contents of each of which are incorporated herein by reference.

BACKGROUND OF THE INVENTION

1. Field of the Invention

The present invention relates to a magnetoresistance effect element, magnetic random access memory, magnetic head, and magnetic reproducer.

2. Description of the Related Art

Examples of the magnetoresistance effect elements include ferromagnetic tunnel junction elements such as a ferromagnetic single tunnel junction element and a ferromagnetic double tunnel junction element (or a tunneling magneto-resistance element "TMR element"). The ferromagnetic single tunnel junction element has a structure in which a pinned ferromagnetic layer, tunnel barrier layer, and free ferromagnetic layer are laminated. The ferromagnetic double tunnel junction element has a structure in which a pinned ferromagnetic layer, tunnel barrier layer, free ferromagnetic layer, tunnel barrier layer, and pinned ferromagnetic layer are laminated. Additionally, the "free ferromagnetic layer" is a ferromagnetic layer whose direction of magnetization is changed on application of an external magnetic field, and the "pinned ferromagnetic layer" is a ferromagnetic layer which maintains the direction of magnetization fixed on the application of the external magnetic field.

The magnetoresistance effect element can be used in a magnetic random access memory (hereinafter referred to as MRAM), magnetic sensor, magnetic head, magnetic reproducer, and the like. In the use, the magnetoresistance effect element is requested to have a sufficiently large magnetoresistance ratio (hereinafter referred to as MR ratio).

An MR ratio of 20% or more is obtained in the TMR element. For example, there has been proposed a ferromagnetic single tunnel junction element obtained by forming a thin Al layer having a thickness of 0.4 nm to 2.0 nm on a ferromagnetic layer, exposing the surface of the layer with an oxygen glow discharge or an oxygen radical, forming a tunnel barrier layer of $AlO_x$, and further forming a ferromagnetic layer on the tunnel barrier layer. According to the ferromagnetic tunnel junction element, an MR ratio of 20% or more is obtained (J. Appl. Phys. 79, 4724 (1996)). Moreover, even in a ferromagnetic tunnel junction formed via magnetic particles dispersed in a dielectric, or a ferromagnetic double tunnel junction (continuous film), the MR ratio of 20% or more is obtained (Jpn. Pat. Appl. KOKAI Publication No. 1997-260743, Phys. Rev. B 56 (10), R5747 (1997)., Applied Magnetics Journal 23, 4-2, (1999), Appl. Phys. Lett. 73(19), 2829 (1998)).

The MR ratio of 20% or more is obtained in the TMR element in this manner. However, when a voltage to be applied to the TMR element is increased to obtain a sufficient output voltage, the MR ratio remarkably drops. The drop of the MR ratio is not large in the ferromagnetic double tunnel junction element as compared with the ferromagnetic single tunnel junction element, but the ratio is not necessarily suppressed sufficiently. Particularly, in a large-capacity (e.g., 256 Mbits or more in the MRAM) MRAM, hard disk drive, and the like, a larger MR ratio is required for the TMR element. That is, there is a strong demand for suppression of the drop of the MR ratio in the use.

Additionally, in Jpn. Pat. Appln. KOKAI Publication No. 2000-25123, there is disclosed a ferromagnetic double tunnel junction element structured by connecting a pair of ferromagnetic tunnel junctions having asymmetric voltage-resistance properties in series so that the voltage-resistance properties are symmetric with respect to a voltage application direction. Additionally, "the voltage-resistance properties are asymmetric" means that the voltage-resistance property in applying the voltage in one direction is different from the voltage-resistance property in applying the voltage in a reverse direction. In the ferromagnetic double tunnel junction element, the voltage-resistance properties of the respective ferromagnetic tunnel junctions constituting the ferromagnetic double tunnel junction are asymmetric, but the voltage-resistance property of the ferromagnetic double tunnel junction is symmetric. According to the ferromagnetic double tunnel junction element, the MR ratio can be set to be substantially constant within a range of about ±0.2 V.

Moreover, in the Jpn. Pat. Appln. KOKAI Publication No. 2000-25123, the following method is described as the method for realizing the asymmetric voltage-resistance property with the ferromagnetic tunnel junction.

A first method comprises: setting a composition to be asymmetric in the tunnel barrier layer of the ferromagnetic tunnel junction. Concretely, when the surface of an Al film deposited on a first ferromagnetic layer is oxidized to form the tunnel barrier layer, oxidation of the Al film proceeds from the surface of the film. This is used, and an oxygen concentration gradient is formed in the tunnel barrier layer. Alternatively, two types of sputtering targets are used in forming the film of the tunnel barrier layer, and a ratio of a power supplied to one target to a power supplied to the other target is changed with an elapse of time, so that a composition distribution is generated in the tunnel barrier layer.

A second method comprises: allowing an interface state to differ between a pinned layer side and a tunnel barrier layer side of the tunnel barrier layer. Concretely, the surface of the Al film deposited on the first ferromagnetic layer is oxidized and the tunnel barrier layer is formed. The oxidization is performed in such a manner that the ferromagnetic layer side of the Al film is prevented from being oxidized. After a second ferromagnetic layer is further deposited on the Al film having the surface oxidized, and annealed, atoms included in the first ferromagnetic layer are diffused in a non-oxidized portion of the Al film, and a layer of a solid solution of a material of the tunnel barrier layer and a material of the first ferromagnetic layer is formed.

It is remarkably difficult to control the composition distribution in the tunnel barrier layer with a high precision or to perform the annealing and control the interface state of the tunnel barrier layer with the high precision. Therefore, in the method described in the Jpn. Pat. Appln. KOKAI Publication No. 2000-25123, when a large number of ferromagnetic tunnel junctions are formed on one substrate, a large dispersion is easily generated in the voltage-resistance property within the substrate.

BRIEF SUMMARY OF THE INVENTION

According to a first aspect of the present invention, there is provided a magnetoresistance effect element comprising a first pinned ferromagnetic layer configured to keep a magnetization direction thereof fixed on application of a magnetic field, a second pinned ferromagnetic layer facing the first pinned ferromagnetic layer and configured to keep a magnetization direction thereof fixed on application of the magnetic field, a surface region of the first pinned ferromagnetic layer and a surface region of the second pinned ferromagnetic layer facing each other being different from each other in composition, a free ferromagnetic layer intervening between the first and second pinned ferromagnetic layers and configured to be capable of changing a magnetization direction thereof on application of the magnetic field, a first tunnel barrier layer intervening between the first pinned ferromagnetic layer and the free ferromagnetic layer, and a second tunnel barrier layer intervening between the second pinned ferromagnetic layer and the free ferromagnetic layer.

According to a second aspect of the present invention, there is provided a magnetoresistance effect element comprising a first pinned ferromagnetic layer configured to keep a magnetization direction thereof fixed on application of a magnetic field, a second pinned ferromagnetic layer facing the first pinned ferromagnetic layer and configured to keep a magnetization direction thereof fixed on application of the magnetic field, a free ferromagnetic layer intervening between the first and second pinned ferromagnetic layers and configured to be capable of changing a magnetization direction thereof on application of the magnetic field, a first tunnel barrier layer intervening between the first pinned ferromagnetic layer and the free ferromagnetic layer, and a second tunnel barrier layer intervening between the second pinned ferromagnetic layer and the free ferromagnetic layer, the first and second tunnel barrier layers being different from each other in composition.

According to a third aspect of the present invention, there is provided a magnetic random access memory comprising: word lines, bit lines intersecting the word lines, and memory cells, each memory cell disposed in each of intersection regions of the word lines and the bit lines, wherein each of the memory cells comprises a magnetoresistance effect element, and the magnetoresistance effect element comprises a first pinned ferromagnetic layer configured to keep a magnetization direction thereof fixed on application of a magnetic field, a second pinned ferromagnetic layer facing the first pinned ferromagnetic layer and configured to keep a magnetization direction thereof fixed on application of the magnetic field, a surface region of the first pinned ferromagnetic layer and a surface region of the second pinned ferromagnetic layer facing each other being different from each other in composition, a free ferromagnetic layer intervening between the first and second pinned ferromagnetic layers and configured to be capable of changing a magnetization direction thereof on application of the magnetic field, a first tunnel barrier layer intervening between the first pinned ferromagnetic layer and the free ferromagnetic layer, and a second tunnel barrier layer intervening between the second pinned ferromagnetic layer and the free ferromagnetic layer.

According to a fourth aspect of the present invention, there is provided a magnetic random access memory comprising word lines, bit lines intersecting the word lines, and memory cells, each memory cell disposed in each of intersection regions of the word lines and the bit lines, wherein each of the memory cells comprises a magnetoresistance effect element, and the magnetoresistance effect element comprises a first pinned ferromagnetic layer configured to keep a magnetization direction thereof fixed on application of a magnetic field, a second pinned ferromagnetic layer facing the first pinned ferromagnetic layer and configured to keep a magnetization direction thereof fixed on application of the magnetic field, a free ferromagnetic layer intervening between the first and second pinned ferromagnetic layers and configured to be capable of changing a magnetization direction thereof on application of the magnetic field, a first tunnel barrier layer intervening between the first pinned ferromagnetic layer and the free ferromagnetic layer, and a second tunnel barrier layer intervening between the second pinned ferromagnetic layer and the free ferromagnetic layer, the first and second tunnel barrier layers being different from each other in composition.

According to a fifth aspect of the present invention, there is provided a magnetic head comprising a support member and a magnetoresistance effect element supported by the support member, wherein the magnetoresistance effect element comprises a first pinned ferromagnetic layer configured to keep a magnetization direction thereof fixed on application of a magnetic field, a second pinned ferromagnetic layer facing the first pinned ferromagnetic layer and configured to keep a magnetization direction thereof fixed on application of the magnetic field, a surface region of the first pinned ferromagnetic layer and a surface region of the second pinned ferromagnetic layer facing each other being different from each other in composition, a free ferromagnetic layer intervening between the first and second pinned ferromagnetic layers and configured to be capable of changing a magnetization direction thereof on application of the magnetic field, a first tunnel barrier layer intervening between the first pinned ferromagnetic layer and the free ferromagnetic layer, and a second tunnel barrier layer intervening between the second pinned ferromagnetic layer and the free ferromagnetic layer.

According to a sixth aspect of the present invention, there is provided a magnetic head comprising a support member and a magnetoresistance effect element supported by the support member, wherein the magnetoresistance effect element comprises a first pinned ferromagnetic layer configured to keep a magnetization direction thereof fixed on application of a magnetic field, a second pinned ferromagnetic layer facing the first pinned ferromagnetic layer and configured to keep a magnetization direction thereof fixed on application of the magnetic field, a free ferromagnetic layer intervening between the first and second pinned ferromagnetic layers and configured to be capable of changing a magnetization direction thereof on application of the magnetic field, a first tunnel barrier layer intervening between the first pinned ferromagnetic layer and the free ferromagnetic layer, and a second tunnel barrier layer intervening between the second pinned ferromagnetic layer and the free ferromagnetic layer, the first and second tunnel barrier layers being different from each other in composition.

According to a seventh aspect of the present invention, there is provided a magnetic reproducer capable of reproducing data recorded on a magnetic recording medium comprising a magnetic head and a mechanism configured to move the magnetic head with respect to the magnetic recording medium, wherein the magnetic head comprises a support member and a magnetoresistance effect element supported by the support member, and the magnetoresistance effect element comprises a first pinned ferromagnetic layer configured to keep a magnetization direction thereof fixed on application of a magnetic field, a second pinned ferromagnetic layer facing the first pinned ferromagnetic layer and configured to keep a magnetization direction thereof fixed on application of the magnetic field, a surface region of the first pinned ferromagnetic layer and a surface region of the second pinned ferromagnetic layer facing each other being different from each other in composition, a free ferromagnetic layer intervening between the first and second pinned ferromagnetic layers and configured to be capable of changing a magnetization direction thereof on application of the magnetic field, a first tunnel barrier layer intervening between the first pinned ferromagnetic layer and the free ferromagnetic layer, and a second tunnel barrier layer intervening between the second pinned ferromagnetic layer and the free ferromagnetic layer.

According to an eighth aspect of the present invention, there is provided a magnetic reproducer capable of reproducing data recorded on a magnetic recording medium comprising a magnetic head and a mechanism configured to move the magnetic head with respect to the magnetic recording medium, wherein the magnetic head comprises a support member and a magnetoresistance effect element supported by the support member, and the magnetoresistance effect element comprises a first pinned ferromagnetic layer configured to keep a magnetization direction thereof fixed on application of a magnetic field a second pinned ferromagnetic layer facing the first pinned ferromagnetic layer and configured to keep a magnetization direction thereof fixed on application of the magnetic field, a free ferromagnetic layer intervening between the first and second pinned ferromagnetic layers and configured to be capable of changing a magnetization direction thereof on application of the magnetic field, a first tunnel barrier layer intervening between the first pinned ferromagnetic layer and the free ferromagnetic layer, and a second tunnel barrier layer intervening between the second pinned ferromagnetic layer and the free ferromagnetic layer, the first and second tunnel barrier layers being different from each other in composition.

BRIEF DESCRIPTION OF THE SEVERAL VIEWS OF THE DRAWING

FIG. 10 is a diagram showing one example of an equivalent circuit of the MRAM according to a fourth embodiment of the present invention;

FIGS. 11A and 11B are diagrams schematically showing another example of the MRAM according to the fourth embodiment of the present invention;

FIGS. 22A and 22B are sectional views schematically showing the MRAM according to a tenth embodiment of the present invention;

FIGS. 23A and 23B are sectional views schematically showing the MRAM according to an eleventh embodiment of the present invention;

FIGS. 26A to 26G are plan views showing examples of plane shapes of the free ferromagnetic layer usable in the TMR element according to the first to twelfth embodiments of the present invention;

FIG. 27 is a graph showing a property of the TMR element according to Example 1;

DETAILED DESCRIPTION OF THE INVENTION

Figure 1:
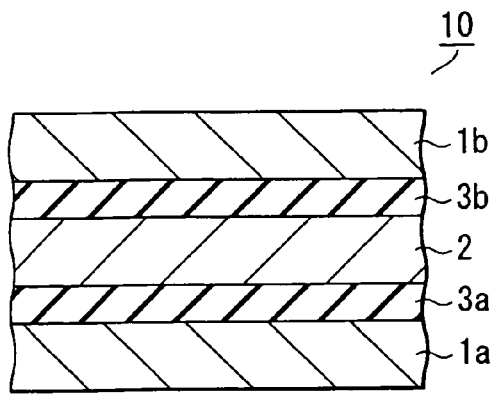
FIG. 1 is a sectional view schematically showing a TMR element according to first to third embodiments of the present invention.

Embodiments of the present invention will be described hereinafter in detail with reference to the drawings. Additionally, constituting elements which fulfill the same functions in the respective drawings are denoted with the same reference numerals, and redundant description is omitted.

FIG. 1 is a sectional view schematically showing a magnetoresistance effect element according to first to third embodiments of the present invention. A magnetoresistance effect element 10 shown in FIG. 1 is a ferromagnetic double tunnel junction element. The TMR element 10 includes a pair of pinned ferromagnetic layers 1a and 1b which are disposed to face each other and whose magnetization directions are fixed. A free ferromagnetic layer 2 whose magnetization direction can be changed in accordance with an external magnetic field is disposed between the pinned ferromagnetic layers 1a and 1b. Moreover, a tunnel barrier layer 3a is disposed between the pinned ferromagnetic layer 1a and the free ferromagnetic layer 2, and these layers form a tunnel junction. Similarly, a tunnel barrier layer 3b is disposed between the pinned ferromagnetic layer 1b and the free ferromagnetic layer 2, and these layers form the tunnel junction.

Figure 2:
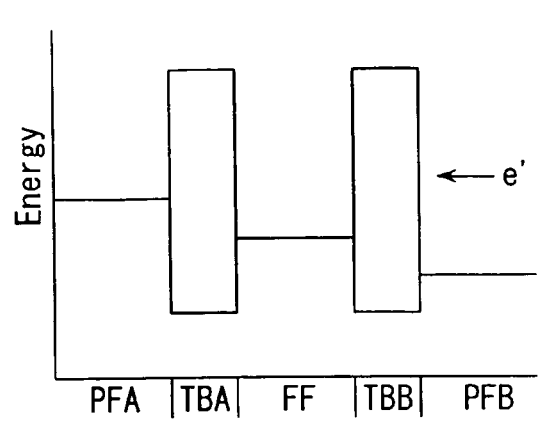
FIG. 2 is a diagram schematically showing one example of an energy band of the TMR element according to the first embodiment of the present invention.

FIG. 2 is a diagram schematically showing one example of an energy band of the TMR element according to the first embodiment of the present invention. In FIG. 2, "PFA" and "PFB" denote the pinned ferromagnetic layers 1a and 1b, respectively, "FF" denotes the free ferromagnetic layer 2, and "TBA" and "TBB" denote the tunnel barrier layers 3a and 3b, respectively. Moreover, in FIG. 2, the ordinate indicates an energy level.

In the first embodiment, compositions of the pinned ferromagnetic layers 1a and 1b are different from each other. Therefore, as shown in FIG. 2, energy levels of Fermi surfaces of the pinned ferromagnetic layers 1a and 1b are different from each other.

If the energy levels of the Fermi surfaces of the pinned ferromagnetic layers 1a and 1b are asymmetric, a voltage-resistance property of the ferromagnetic double tunnel junction element 10 becomes asymmetric. For example, when the energy levels of the Fermi surfaces of the pinned ferromagnetic layers 1a and 1b are equal to each other, and heights of energy barriers of the tunnel barrier layers 3a and 3b are equal to each other, an MR ratio is largest with a bias voltage of 0 V, and decreases in accordance with an increase of an absolute value of a bias voltage. On the other hand, when the energy levels of the Fermi surfaces are allowed to differ from each other between the pinned ferromagnetic layers 1a and 1b, the bias voltage for obtaining the maximum MR ratio shifts from 0 V. Therefore, the bias voltage is applied in a direction in which the maximum MR ratio is obtained (as an electron moving in a direction shown by an arrow in FIG. 2). Then, even when the absolute value of the bias voltage is large, a sufficient large MR ratio can be obtained, and a large signal voltage can be obtained. Additionally, with use of the structure, such a shift is assumed to be caused when an effective barrier height differs with movement of the electron to the pinned ferromagnetic layer 1b from the pinned ferromagnetic layer 1a, and movement of the electron to the pinned ferromagnetic layer 1a from the pinned ferromagnetic layer 1b.

Moreover, it is easy to form the ferromagnetic layer having a uniform composition. Therefore, in a method for allowing the compositions of the pinned ferromagnetic layers 1a and 1b to differ from each other in order to set the voltage-resistance property to be asymmetric, when a large number of ferromagnetic double tunnel junctions 10 are formed on one substrate, a dispersion can easily be inhibited from being generated in the voltage-resistance property in the substrate.

In the first embodiment, when an energy level $E_{PFA}$ of the Fermi surface of the pinned ferromagnetic layer 1a is different from an energy level $E_{PFB}$ of the Fermi surface of the pinned ferromagnetic layer 1b, relative heights of an energy level $E_{FF}$ of the Fermi surface of the free ferromagnetic layer 2 and energy levels $E_{PFA}$, $E_{PFB}$ are not particularly limited. For example, as shown in FIG. 2, the energy level $E_{FF}$ may be between the energy levels $E_{PFA}$ and $E_{PFB}$. Alternatively, the energy levels $E_{PFA}$ and $E_{PFB}$ may satisfy relations shown in FIGS. 3A to 3D.

FIGS. 3A to 3D are diagrams schematically showing other examples of the energy band of the TMR element according to the first embodiment of the present invention. In the diagram, "PFA" and "PFB" denote the pinned ferromagnetic layers 1a and 1b, respectively, "FF" denotes the free ferromagnetic layer 2, and "TBA" and "TBB" denote the tunnel barrier layers 3a and 3b, respectively. Moreover, in FIG. 3, the ordinate indicates the energy level.

Figure 3A:
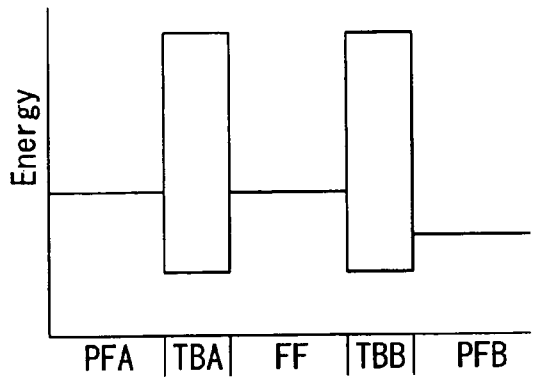
FIGS. 3A to 3D are diagrams schematically showing other examples of the energy band of the TMR element according to the first embodiment of the present invention.
Figure 3B:
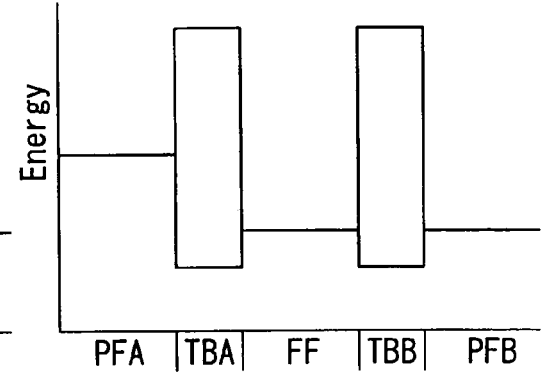
Figure 3C:
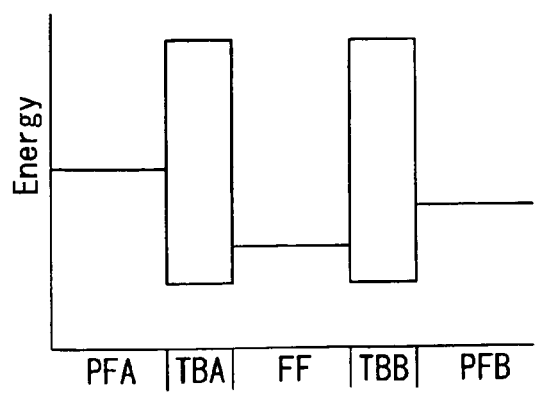
Figure 3D:
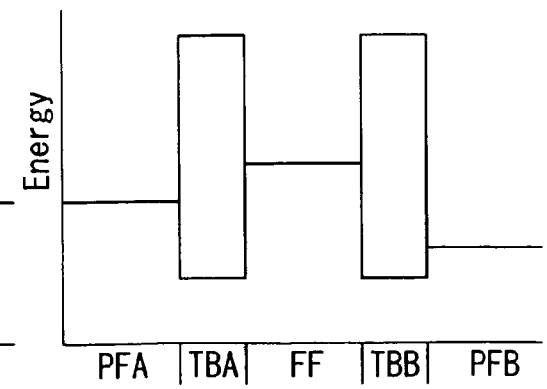

In the first embodiment, as shown in FIGS. 3A and 3B, energy level $E_{FF}$ may be equal to either one of $E_{PFA}$ and $E_{PFB}$. Moreover, as shown in FIG. 3C, the energy level $E_{FF}$ may be lower than both $E_{PFA}$ and $E_{PFB}$. Furthermore, as shown in FIG. 3D, the energy level $E_{FF}$ may be higher than both $E_{PFA}$ and $E_{PFB}$.

In the first embodiment, the larger a difference between the energy levels $E_{PFA}$ and $E_{PFB}$ is, the larger the shift from a bias voltage of 0 V at which the maximum MR ratio is obtained becomes. That is, even when the absolute value of the bias voltage is larger, the sufficiently large MR ratio can be obtained.

The effect can theoretically be obtained even when the difference between the energy levels $E_{PFA}$ and $E_{PFB}$ is slight. However, in actual, when the difference between the energy levels $E_{PFA}$ and $E_{PFB}$ is not sufficiently large, the aforementioned effect hardly appears in many cases.

For example, when the pinned ferromagnetic layers 1a and 1b contain elements different from each other, the effect conspicuously appears. Moreover, materials of both the pinned ferromagnetic layers 1a and 1b have compositions represented by a general formula: $A_m B_{(1-m)}$ such as a Co—Fe alloy, Co—Ni alloy, Ni—Fe alloy, and Co—Fe—Ni alloy. In this case, usually, when m differs by 10 atomic % or more between the pinned ferromagnetic layers 1a and 1b, the effect remarkably appears. When m differs by 20 atomic % or more, the effect more remarkably appears. It is noted that m may differ by 40 atomic % or more between the pinned ferromagnetic layers 1a and 1b. Additionally, "A" and "B" denote one or more types of elements.

In the first embodiment, each of the compositions of the tunnel barrier layers 3a and 3b is preferably homogeneous. In this case, the dispersion of the voltage-resistance property in the substrate can more effectively be inhibited from being generated. Such homogenization can be achieved, for example, by the following method. That is, oxides or nitrides of metals such as Al and Mg are used as the materials of the tunnel barrier layers 3a and 3b, and the tunnel barrier layers 3a and 3b are annealed at 300° C. or more. When the annealing is performed, oxygen and nitrogen are diffused and recombined in the tunnel barrier layers 3a and 3b. Therefore, the compositions are homogenized in the respective tunnel barrier layers 3a and 3b.

Moreover, in the first embodiment, the compositions are allowed to differ between the pinned ferromagnetic layers 1a and 1b, but each of the compositions of the pinned ferromagnetic layers 1a and 1b is preferably homogeneous. In this case, the dispersion of the voltage-resistance property in the substrate can more effectively be inhibited from being generated. The homogenization can be achieved, for example, by the following method. That is, the respective ferromagnetic layers 1a and 1b are formed by a sputtering method using sputtering a target whose composition is substantially equal the compositions of the layers 1a and 1b. Alternatively, each of the ferromagnetic layers 1a and 1b is formed by the sputtering method in which a plurality of types of sputtering targets are used, and in this case, a ratio of powers supplied to the targets is maintained to be constant.

As described above, according to the first embodiment, it is possible to obtain a high output signal voltage and to suppress the dispersion of the MR ratio. In this manner, the high output signal voltage and suppressed dispersion of the MR ratio are remarkably useful in realizing a large-capacity MRAM.

Figure 4:
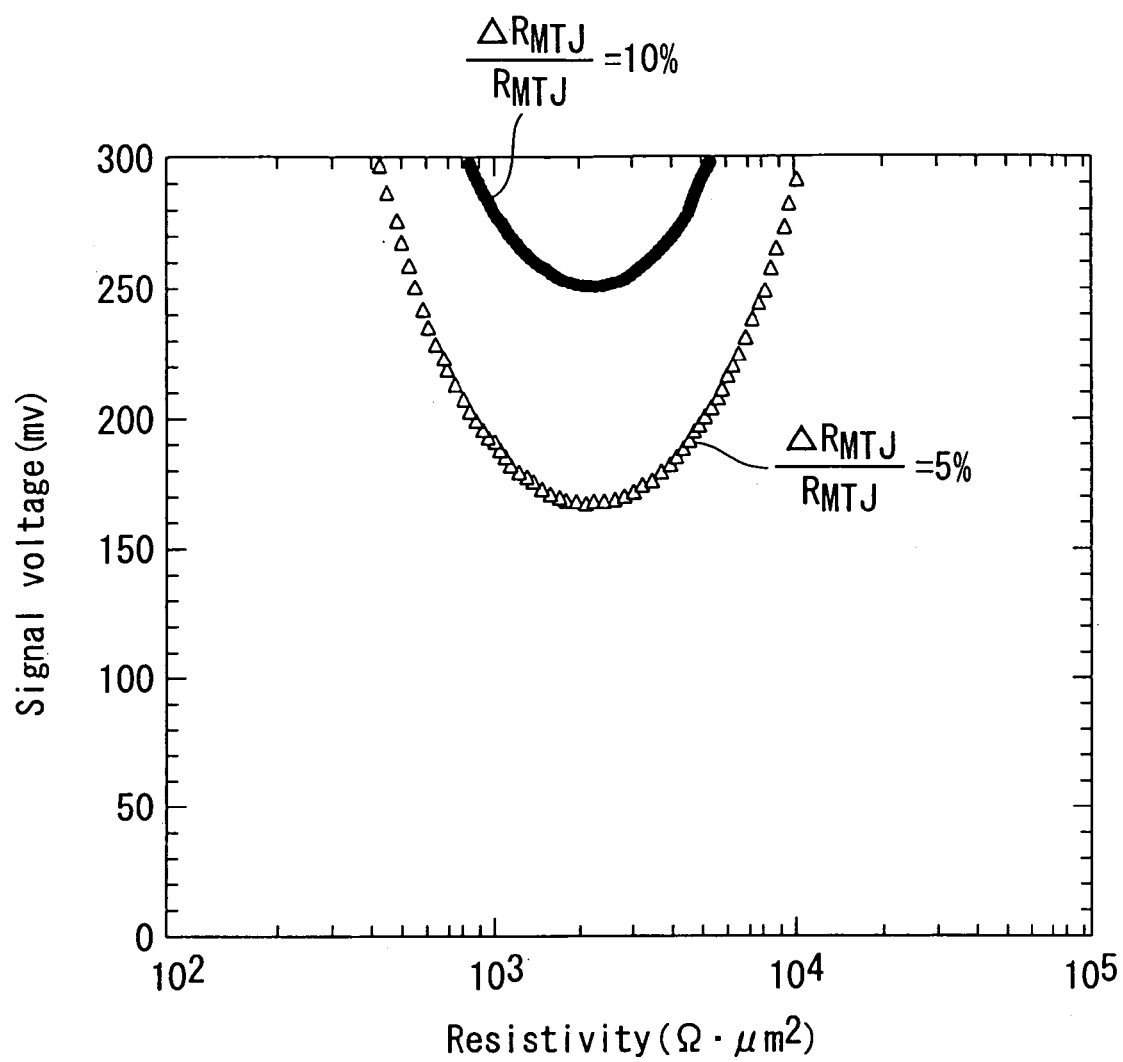
FIG. 4 is a graph showing one example of standards of an output voltage and a resistivity applied to the TMR element of MRAM of 256 Mbits.

FIG. 4 is a graph showing one example of a standard of the output voltage and a resistivity applied to the TMR element of MRAM of 256 Mbits. The standard relates to the MRAM of 256 Mbits in which 1Tr-1 magnetic tunnel junction (MTJ) architecture is used. Additionally, the 1Tr-1MTJ architecture has a structure in which the memory cell is composed of one transistor and one TMR element. In FIG. 4, the abscissa indicates the resistivity, and the ordinate indicates the output signal voltage. Moreover, FIG. 4 shows data in cases in which a dispersion $\Delta R_{MTJ}/R_{MTJ}$ of the resistivity of the TMR (MTJ) element is 5% and 10%. A 1CMOS-1MTJ architecture is assumed in calculating the data shown in FIG. 4. Additionally, it is assumed that a design rule F is 0.175 µm, a signal voltage $V_S$ before amplification by a sense amplifier is 50 mV, a resistivity $r_{cmos}$ of CMOS is 10 kΩ, a dispersion of the resistivity $r_{cmos}$ is 10%, a capacity $C_B$ of a bit line is 320 fF, the bias voltage applied to the element is 800 mV, and access time $T_S$ is 40 nS.

In the MRAM of 256 Mbits, an output signal voltage of at least 170 mV is requested, and the output signal voltage is desired to be in a range of 200 to 300 mV. As apparent from FIG. 4, the standard of the output signal voltage in applying a bias voltage of 800 mV largely differs with cases in which the dispersion of the resistivity of MTJ is 5% and 10%. Therefore, even when a sufficiently large output voltage is obtained, the large-capacity MRAM cannot be realized in the case that the dispersion of the resistivity is large.

On the other hand, according to the first embodiment, as described above, it is possible both to realize the high output signal voltage and to suppress the dispersion of the MR ratio. Therefore, according to the first embodiment, the large-capacity MRAM can be realized.

A second embodiment of the present invention will next be described. The second embodiment is similar to the first embodiment except that the compositions of the pinned ferromagnetic layers 1a and 1b are equal to each other and that the compositions of the tunnel barrier layers 3a and 3b are different from each other.

Figures 5, 6A:
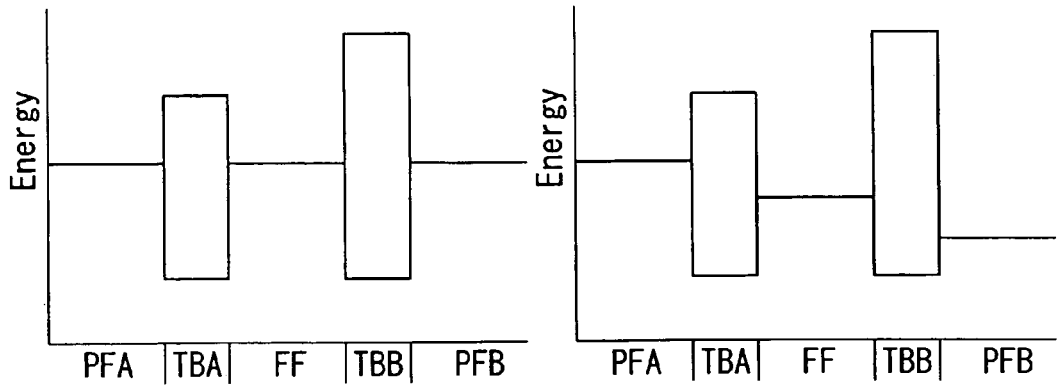
FIG. 5 is a diagram schematically showing one example of the energy band of the TMR element according to a second embodiment of the present invention.
FIGS. 6A to 6E are diagrams schematically showing examples of the energy band of the TMR element according to a third embodiment of the present invention.
Figures 6B, 6C:
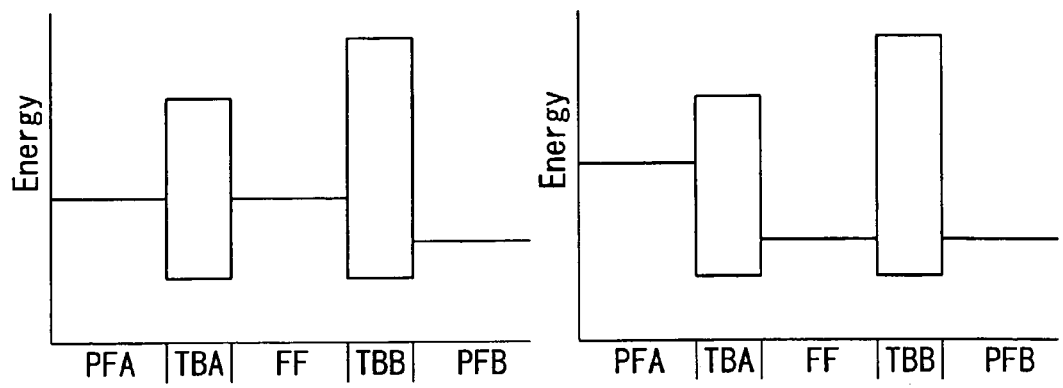
Figures 6D, 6E:
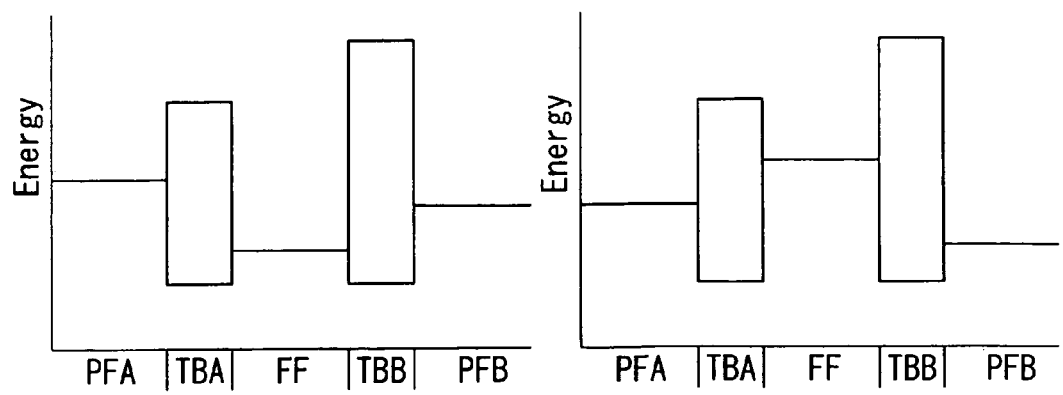

FIG. 5 is a diagram schematically showing one example of the energy band of the TMR element according to the second embodiment of the present invention. In the second embodiment, the compositions of the tunnel barrier layers 3a and 3b are different from each other. Therefore, as shown in FIG. 5, energy barriers $E_{TBA}$ and $E_{TBB}$ of the tunnel barrier layers 3a and 3b are different from each other. Even when the energy barriers $E_{TBA}$ and $E_{TBB}$ are different from each other in this manner, an effect similar to that of the first embodiment can be obtained.

In the second embodiment, the larger a difference between the energy barriers $E_{TBA}$ and $E_{TBB}$ is, the larger the shift from the bias voltage of 0 V at which the maximum MR ratio is obtained becomes. That is, even when the absolute value of the bias voltage is larger, the sufficiently large MR ratio can be obtained. Such effect hardly appears in many cases, unless the difference of the energy barrier is sufficiently large.

The effect remarkably appears, for example, when the tunnel barrier layers 3a and 3b contain elements different from each other. That is, when the compositions of the tunnel barrier layers 3a and 3b are represented by either one of general formulas MO and MN (M denotes the metal), and when the metals M differ between the tunnel barrier layers 3a and 3b, the effect remarkably appears. Alternatively, when one composition of the tunnel barrier layers 3a and 3b is represented by the general formula MO, and the other composition is represented by the general formula MN, the effect remarkably appears. Furthermore, when one composition of the tunnel barrier layers 3a and 3b is represented by the general formula MO, the other composition is represented by the general formula MN, and the metals M differ between the tunnel barrier layers 3a and 3b, the effect more remarkably appears.

Moreover, both materials of the tunnel barrier layers 3a and 3b have compositions represented by a general formula: $MC_nD_{(1-n)}$ such as AlO, AlN and AlON. In this case, usually, when n differs by 20 atomic % or more between the tunnel barrier layers 3a and 3b, the effect remarkably appears. When n differs by 30 atomic % or more, the effect more remarkably appears. Additionally, "M" denotes at least one metal such as aluminum, and "C" and "D" denote elements such as oxygen and nitrogen.

In the second embodiment, each of the compositions of the tunnel barrier layers 3a and 3b is preferably homogeneous. When at least one composition of the tunnel barrier layers 3a and 3b is not homogeneous, the signal voltage sometimes drops. The homogenization is enabled, for example, by the following method. That is, oxides or nitrides of metals such as Al and Mg are used as the materials of the tunnel barrier layers 3a and 3b. The metal oxide film or the metal nitride film is formed so that a concentration of oxygen and nitrogen becomes relatively high. For the tunnel barrier layers 3a and 3b obtained in this method, a oxygen concentration distribution or a nitrogen concentration distribution is homogenized.

A third embodiment of the present invention will next be described. The third embodiment is similar to the first embodiment except that the compositions of the pinned ferromagnetic layers 1a and 1b are different from each other and that the compositions of the tunnel barrier layers 3a and 3b are different from each other. That is, the third embodiment includes a combination of the first and second embodiments. Therefore, according to the third embodiment, the effect that the high output signal voltage is obtained and the dispersion of the MR ratio is suppressed becomes more remarkable.

FIGS. 6A to 6E are diagrams schematically showing examples of the energy band of the TMR element according to the third embodiment of the present invention. In the third embodiment, the energy levels $E_{PFA}$ and $E_{PFB}$ of the Fermi surfaces of the pinned ferromagnetic layers 1a and 1b and the energy barriers $E_{TBA}$ and $E_{TBB}$ of the tunnel barrier layers 3a and 3b may satisfy any one of relations shown in FIGS. 6A to 6E. Additionally, when the energy band is as shown in FIG. 6A, a largest output signal voltage is obtained in many cases.

In the first to third embodiments, the following structure can be used in the TMR element 10.

Figure 7:
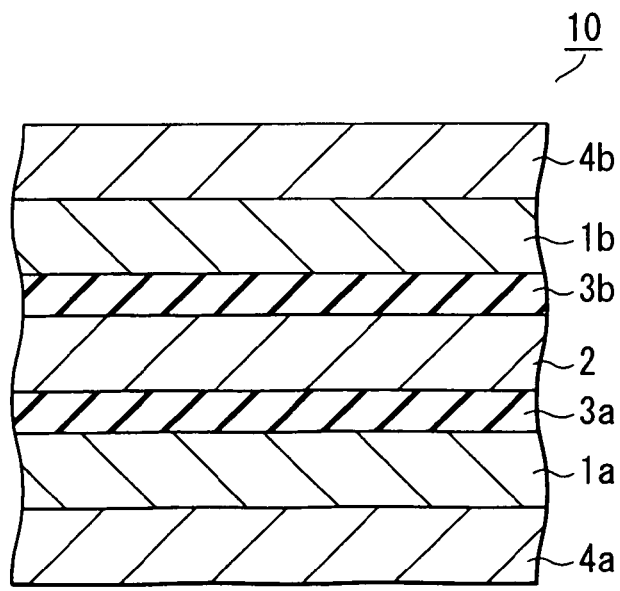
FIG. 7 is a sectional view showing one example of a structure usable in the TMR element according to the first to third embodiments of the present invention.

FIG. 7 is a sectional view showing one example of a structure usable in the TMR element 10 according to the first to third embodiments of the present invention. The TMR element 10 shown in FIG. 7 is a ferromagnetic double tunnel junction element of a spin-valve type. In the TMR element 10, antiferromagnetic layers 4a and 4b are disposed outside the pinned ferromagnetic layers 1a and 1b, respectively. The structure is advantageous for preventing the magnetization directions of the pinned ferromagnetic layers 1a and 1b from being changed by an external magnetic field.

In the TMR element 10 according to the first to third embodiments, each of the pinned ferromagnetic layers 1a and 1b may have a single layer structure or a multilayered structure.

FIGS. 8A to 8D are sectional views schematically showing the structure of the pinned ferromagnetic layer usable in the TMR element 10 of FIG. 1. Additionally, in the sectional views, the surface of the pinned ferromagnetic layer facing the free ferromagnetic layer 2 is drawn upwards.

Figure 8A:
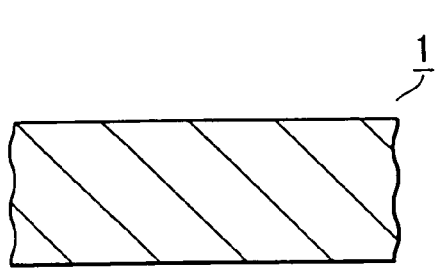
FIGS. 8A to 8D are sectional views showing structures of a pinned ferromagnetic layer usable in the TMR element of FIG. 1.

A pinned ferromagnetic layer 1 shown in FIG. 8A has a single layer structure including the ferromagnetic material. The pinned ferromagnetic layer 1 shown in FIG. 8B has a structure in which a ferromagnetic layer 1-1, nonmagnetic layer 1-2, and ferromagnetic layer 1-3 are laminated. The pinned ferromagnetic layer 1 shown in FIG. 8C has a structure similar to that of the pinned ferromagnetic layer 1 shown in FIG. 8B except that a three-layers structure including a ferromagnetic layer 1-4, barrier metal layer 1-5 such as an amorphous magnetic layer, and ferromagnetic layer 1-6 is used instead of the ferromagnetic layer 1-3. The pinned ferromagnetic layer 1 shown in FIG. 8D has a structure similar to that of the pinned ferromagnetic layer 1 shown in FIG. 8C except that the three-layers structure including a ferromagnetic layer 1-7, barrier metal layer 1-8 such as the amorphous magnetic layer, and ferromagnetic layer 1-9 is used instead of the ferromagnetic layer 1-1.

Figure 8B:
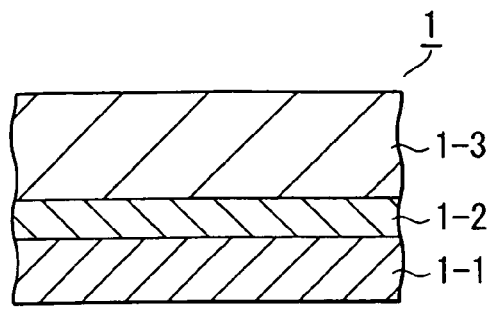
Figure 8C:
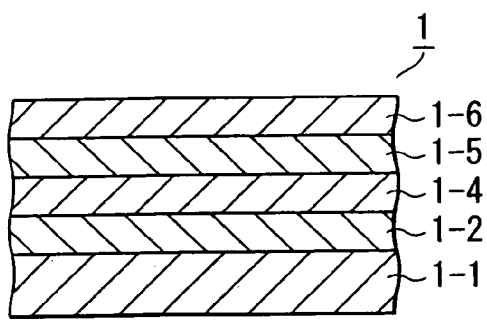
Figure 8D:
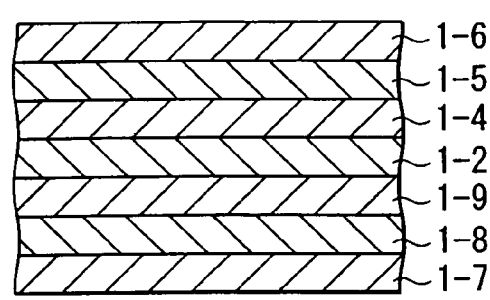

In the TMR element 10, any one of the structures of FIGS. 8B to 8D is preferably used in at least one of the pinned ferromagnetic layers 1a and 1b, and any one of the laminate structures of FIGS. 8B to 8D is more preferably used in both of the pinned ferromagnetic layers 1a and 1b. Additionally, the structures of the pinned ferromagnetic layers 1a and 1b may be equal to each other or different from each other. In this case, as shown in FIG. 7, the antiferromagnetic layers 4a and 4b are preferably disposed. Moreover, when at least one of the pinned ferromagnetic layers 1a and 1b has any one of the laminate structures of FIGS. 8B to 8D in the first to third embodiments, it is sufficient that the compositions are different from each other between the ferromagnetic layers positioned on the side of the free ferromagnetic 2 of the pinned ferromagnetic layers 1a and 1b.

When the pinned ferromagnetic layer 1 includes a pair of ferromagnetic layers and the nonmagnetic layer disposed between the ferromagnetic layers as shown in FIGS. 8B to 8D, the ferromagnetic layers antiferromagnetically interact via the nonmagnetic layer, the magnetization direction of the pinned ferromagnetic layer 1 can more firmly be fixed. Therefore, when the TMR element 10 is applied to the MRAM, the writing of information can be repeated while completely preventing a problem of an output drop caused by a partial rotation of magnetic moment of the pinned ferromagnetic layer. Additionally, the thickness of the antiferromagnetic layer can be reduced, and a processing precision is improved. Therefore, the dispersion of a magnetic field intensity required for switching decreases.

Moreover, in this case, a stray field from the pinned ferromagnetic layer can be decreased (or adjusted). Furthermore, when the film thickness of the pair of ferromagnetic layers included in the pinned ferromagnetic layer is allowed to differ, the magnetization shift of the free ferromagnetic layer 2 can be adjusted. In this case, as shown in FIG. 8B, among the ferromagnetic layers included in the pinned ferromagnetic layer, the layer disposed closer to the tunnel barrier layer is preferably set to be thicker. Moreover, as shown in FIGS. 8C and 8D, when the barrier metal layers such as the amorphous magnetic layer and oxidized magnetic layer are inserted, a reliability such as a long-time anneal property is enhanced.

In the TMR element 10 according to the first to third embodiments, the free ferromagnetic layer 2 may have the single layer structure or the multilayered structure.

Figure 9A:
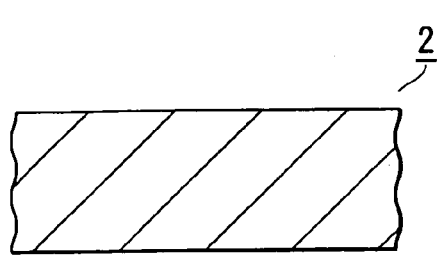
FIGS. 9A to 9C are sectional views showing structures of a free ferromagnetic layer usable in the TMR element of FIG. 1.
Figure 9B:
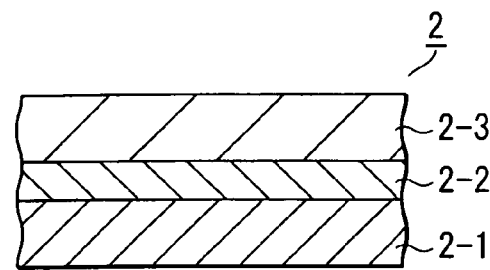
Figure 9C:
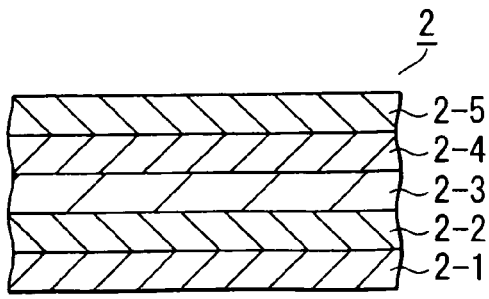

FIGS. 9A to 9C are sectional views schematically showing the structures of the free ferromagnetic layer usable in the TMR element 10 of FIG. 1.

The free ferromagnetic layer 2 shown in FIG. 9A has the single layer structure including the ferromagnetic material. The free ferromagnetic layer 2 shown in FIG. 9B has a structure in which a ferromagnetic layer 2-1, nonmagnetic layer 2-2, and ferromagnetic layer 2-3 are laminated. The free ferromagnetic layer 2 shown in FIG. 9C has a structure in which the ferromagnetic layer 2-1, nonmagnetic layer 2-2, ferromagnetic layer 2-3, nonmagnetic layer 2-4, and ferromagnetic layer 2-5 are laminated.

When the free ferromagnetic layer 2 has the three-layers structure as shown in FIG. 9B, the ferromagnetic layers 2-1 and 2-3 are preferably ferromagnetically connected weakly or antiferromagnetically connected with each other via the nonmagnetic layer 2-2. Similarly, as shown in FIG. 9C, when the free ferromagnetic layer 2 has a five-layers structure, preferably the ferromagnetic layers 2-1 and 2-3 are ferromagnetically connected weakly or antiferromagnetically connected via the nonmagnetic layer 2-2 and the ferromagnetic layers 2-3 and 2-5 are ferromagnetically connected weakly or antiferromagnetically connected via the nonmagnetic layer 2-4. According to the structure, dependence of the magnetic field intensity required for the switching on the cell width is reduced. That is, even when the cell width is narrowed, the magnetic field intensity required for switching can be inhibited from increasing. Therefore, even when the width of the TMR element 10 is reduced in order to increase the capacity of the MRAM, there is no fear of an increase of power consumption or electro-migration of wiring during writing. Therefore, the larger-capacity MRAM can be realized. Additionally, the strength of the ferromagnetic connection or the anti ferromagnetic connection is preferably small. As the intensity of the ferromagnetic connection decreases, the switching can be achieved in the magnetic field with a smaller intensity. Moreover, even when the free ferromagnetic layer 2 is composed of three or more layers, the magnetic field intensity required for the switching does not increase. Furthermore, when the laminate structure is used in the free ferromagnetic layer 2, super-paramagnetism is not obtained even with the smaller film thickness, and a more superior thermal stability can be realized as compared with the use of the single layer structure.

In the first to third embodiments, the material of the ferromagnetic layer is not particularly limited as far as the ferromagnetic layer indicates ferromagnetism. Examples of magnetic materials usable in the ferromagnetic layer include Fe, Co, Ni, and an alloy of these metals; oxides such as magnetite having a large spin polarization ratio, $CrO_2$, and $RXMnO_{3-y}$ (R: rare earth elements, X: Ca, Ba or Sr); Heusler's alloys such as NiMnSb and PtMnSb; and magnetic semiconductors such as Zn—Mn—O, Ti—Mn—O, CdMnP$_2$, and ZnMnP$_2$. The film thickness of the ferromagnetic layer needs to be large to such an extent that superparamagnetism is not obtained, and is preferably 0.4 nm or more. Moreover, when the ferromagnetic layer is excessively thick, a stronger magnetic field is necessary for the switching. Therefore, the film thickness of the ferromagnetic layer is preferably 2.5 nm or less. Furthermore, in addition to the aforementioned magnetic materials, the ferromagnetic layer can contain nonmagnetic elements such as Ag, Cu, Au, Al, Mg, Si, Bi, Ta, B, C, O, N, Si, Pd, PT, Zr, Ir, W, Mo, Nb within a range in which the ferromagnetism is not lost. When the nonmagnetic elements are added, physical properties such as a magnetic property, crystallinity, mechanical property, and chemical property of the ferromagnetic layer can be adjusted.

In the first to third embodiments, a dielectric (or an insulator) can be used as the material of the tunnel barrier layer. Examples of the dielectric include Al$_2$O$_3$, SiO$_2$, MgO, AlN, AlON, GaO, Bi$_2$O$_3$, SrTiO$_2$, AlLaO$_3$, and the like. Additionally, oxygen, nitrogen, or fluorine omission may exist in these dielectrics. The optimum thickness of the tunnel barrier layer changes in accordance with a junction area of the TMR element, but is preferably 3 nm or less.

In the first to third embodiments, examples of the material of the antiferromagnetic layer include Fe—Mn, Pt—Mn, Pt—Cr—Mn, Ni—Mn, Ir—Mn, NiO, and the like.

In the first to third embodiments, examples of the material of the nonmagnetic layer include Cu, Au, Ru, Ir, Rh, Ag, and the like. Additionally, the formation of the ferromagnetic connection or the antiferromagnetic connection by the structure of the nonmagnetic layer held between the pair of ferromagnetic layers can be controlled by the material, film thickness, and the like of the ferromagnetic layer and nonmagnetic layer. For example, Ru, Ir, Rh, and the like are preferably used as the nonmagnetic layer in order to form the antiferromagnetic connection in the pinned ferromagnetic layer, and Cu, Au, Ag, and the like are preferably used as the nonmagnetic layer in order to form the ferromagnetic junction in the free ferromagnetic layer.

The TMR element 10 can be formed by forming the films of the ferromagnetic layer, dielectric layer, nonmagnetic layer, antiferromagnetic layer, and the like on the substrate. The material of the substrate is not particularly limited, and, for example, Si, SiO$_2$, Al$_2$O$_3$, spinel, AlN, and the like can be used. Moreover, as an underlayer or a protective layer, a single layer film such as Ta, Ti, Pt, Pd, and Au, or a laminated film such as Ti/Pt, Ta/Pt, Ti/Pd, Ta/Pd, and Ta/Ru may further be formed.

Various thin films noted above can be formed using thin film forming methods such as a sputtering method, vapor deposition method, and molecular beam epitaxial method.

A fourth embodiment of the present invention will next be described. In the fourth embodiment, the MRAM using the TMR element 10 according to the first to third embodiments and transistor will be described.

FIG. 10 is a diagram showing one example of an equivalent circuit of the MRAM according to the fourth embodiment of the present invention. In the MRAM shown in FIG. 10, a reading word line (WL1) 33 and writing word line (WL2) 34 connected to a row decoder 31 intersect a bit line (BL) 35 connected to a column decoder 32. Memory cells including the TMR elements 10 and transistors 20 such as MOSFET are disposed in the vicinity of the respective intersections of the word lines 33, 34 and bit line 35.

FIGS. 11A and 11B are sectional views schematically showing one example of the MRAM according to the fourth embodiment of the present invention. The MRAM shown in FIGS. 11A and 11B has a circuit constitution shown in FIG. 10. The MRAM includes a substrate 30. Source/drain regions 23, 24 of the transistor 20 are formed in the surface region of the substrate 30, and the word line 33 is used as a gate electrode of the transistor 20. The source/drain region 24 is connected to an underlayer wiring 37 via a contact 36. The TMR element 10 is formed on the underlayer wiring 37, and the bit line 35 is connected to the underlayer wiring 37 via the TMR element 10. The word line 34 intersects at right angles to the bit line 35 under the TMR element 10. Additionally, a reference numeral 38 denotes an insulating film.

In the MRAM, when information is written in the TMR element 10, the magnetization of the free ferromagnetic layer 2 of the TMR element 10 is reversed by a synthesized magnetic field of a magnetic field generated by causing a current pulse to flow through the word line 34 and a magnetic field generated by causing a current pulse to flow through the bit line 35. Moreover, in the MRAM, when the information written in the TMR element 10 is read out, the current is caused to flow through the TMR element 10 selected by the transistor 20, and it is judged whether the information written is "1" or "0" in accordance with the resistance of the TMR element 10.

The MRAM of the fourth embodiment can have another structure.

Figure 12A:
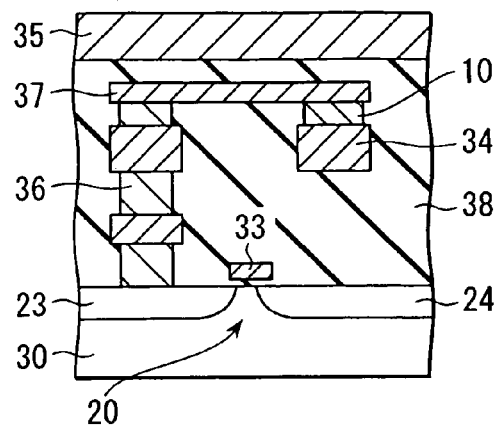
FIGS. 12A and 12B are diagrams schematically showing another example of the MRAM according to the fourth embodiment of the present invention.
Figure 12B:
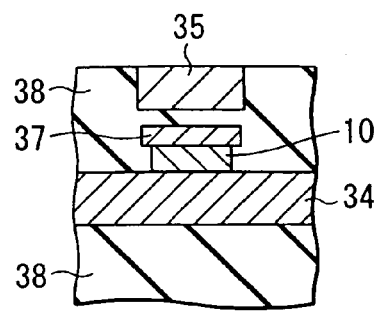

FIGS. 12A and 12B are sectional views schematically showing another example of the MRAM according to the fourth embodiment of the present invention. The MRAM shown in FIGS. 12A and 12B has a structure similar to the structure of the MRAM shown in FIGS. 11A and 11B except that the TMR element 10 is insulated from the bit line 35 and connect the underlayer wiring 37 with the word line 34.

In the MRAM of FIGS. 11A and 11B, 12A and 12B, a magnetic film may be disposed around the bit line 35 or the word line 34.

Figure 13A:
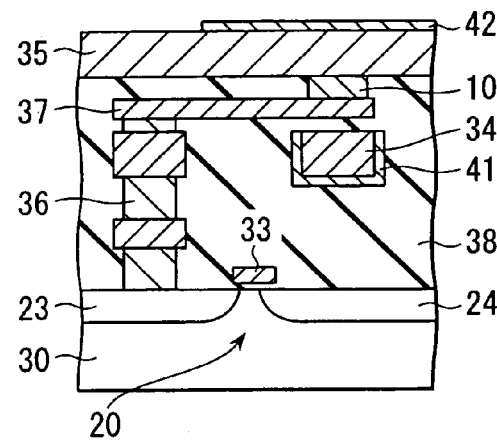
FIGS. 13A and 13B are sectional views schematically showing a modification example of the MRAM of FIGS. 11A and 11B.
Figure 13B:
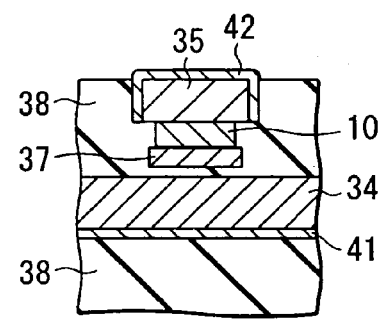
Figure 14A:
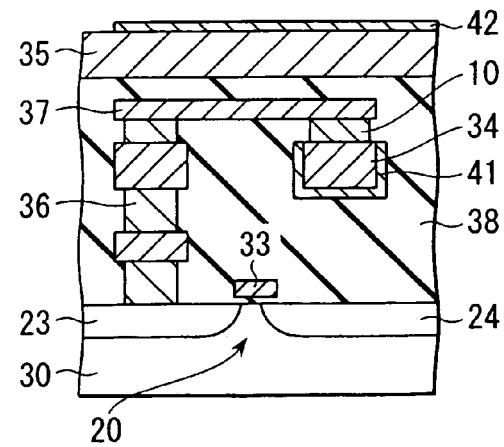
FIGS. 14A and 14B are sectional views schematically showing a modification example of the MRAM of FIGS. 12A and 12B.
Figure 14B:
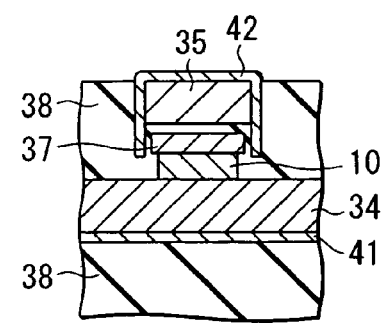

FIGS. 13A and 13B are sectional views schematically showing a modification example of the MRAM of FIGS. 11A and 11B. FIGS. 14A and 14B are sectional views schematically showing a modification example of the MRAM of FIGS. 12A and 12B. In the MRAM shown in FIGS. 13A and 13B, 14A and 14B, magnetic films 41 and 42 are disposed around the word line 34 and bit line 35, respectively. When the magnetic films 41 and 42 are disposed in this manner, the magnetic field generated by causing the current pulses to flow through the bit line 35 and word line 34 can effectively act on the TMR element 10. Additionally, the magnetic field can be prevented from leaking and acting on the non-selected TMR element 10. Additionally, in FIGS. 14A and 14B, the magnetic film 42 covering the line 35 which faces the underlayer wiring 37 extends to the vicinity of the side surface of the TMR element 10. According to the structure, the magnetic field can more effectively act on the TMR element 10 as compared with the structure shown in FIGS. 13A and 13B.

A fifth embodiment of the present invention will next be described. In the fifth embodiment, the MRAM using the TMR element 10 according to first to third embodiments and a diode will be described.

Figure 15:
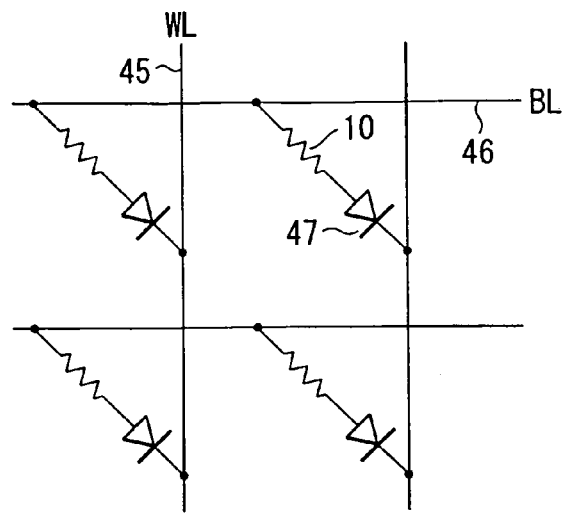
FIG. 15 is a diagram showing one example of the equivalent circuit of the MRAM according to a fifth embodiment of the present invention.

FIG. 15 is a diagram showing one example of the equivalent circuit of the MRAM according to the fifth embodiment of the present invention. In the MRAM shown in FIG. 15, a word line (WL) 45 connected to a row decoder (not shown) intersects a bit line (BL) 46 connected to a column decoder (not shown). The memory cells including the TMR element 10 and a diode 47 are connected in series in the vicinity of the respective intersections of the word lines 45 and bit lines 46.

Figure 16:
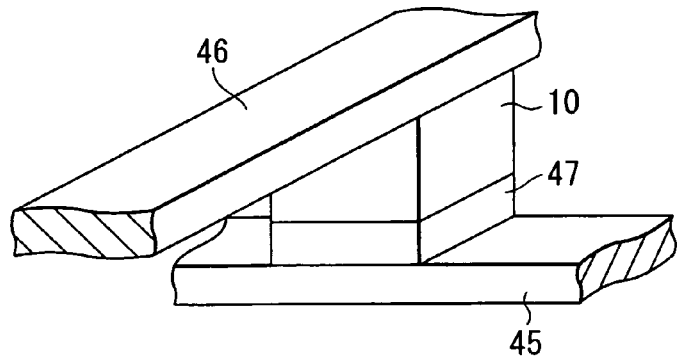
FIG. 16 is a perspective view schematically showing one example of the MRAM according to the fifth embodiment of the present invention.
Figure 17:
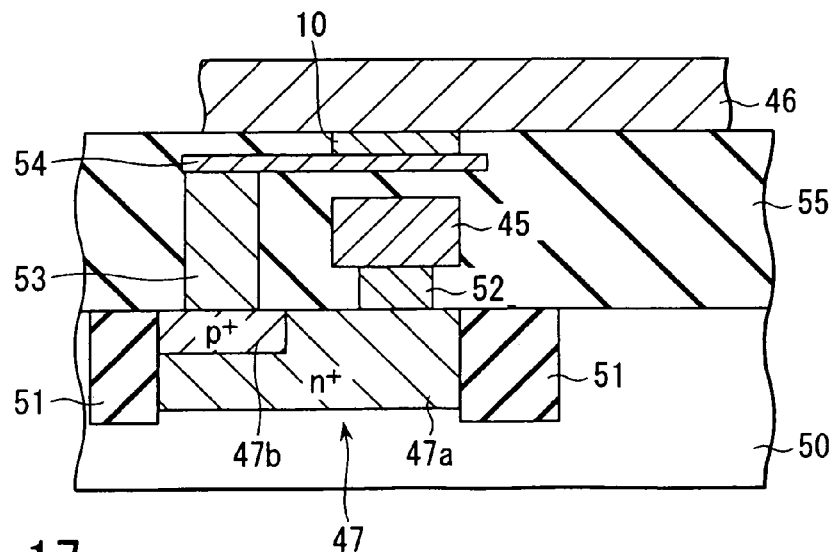
FIG. 17 is a sectional view schematically showing another example of the MRAM according to the fifth embodiment of the present invention.

FIG. 16 is a perspective view schematically showing one example of the MRAM according to the fifth embodiment of the present invention. FIG. 17 is a sectional view schematically showing another example of the MRAM according to the fifth embodiment of the present invention. Additionally, FIG. 16 shows only major constituting elements.

The MRAM shown in FIGS. 16 and 17 has a circuit constitution shown in FIG. 15.

In the MRAM of FIG. 16, a diode 222, TMR element 10, and bit line 227 are successively formed on a word line 223.

In the MRAM of FIG. 17, a device isolation insulating film 51 is formed in the surface region of a semiconductor substrate 50. The diode 47 including a p-type region 47b and n-type region 47a is formed in an element region separated by the device isolation insulating films 51. The word line 45 is connected to the n-type region 47a via a contact 52. An underlayer wiring 54 is connected to the p-type region 47b via a contact 53. The TMR element 10 is formed on the underlayer wiring 54, and the bit line 46 is formed on the TMR element 10. Additionally, a reference numeral 55 is an interlayer insulating film. An SOI substrate is preferably used as the substrate 50.

A sixth embodiment of the present invention will next be described.

Figure 18:
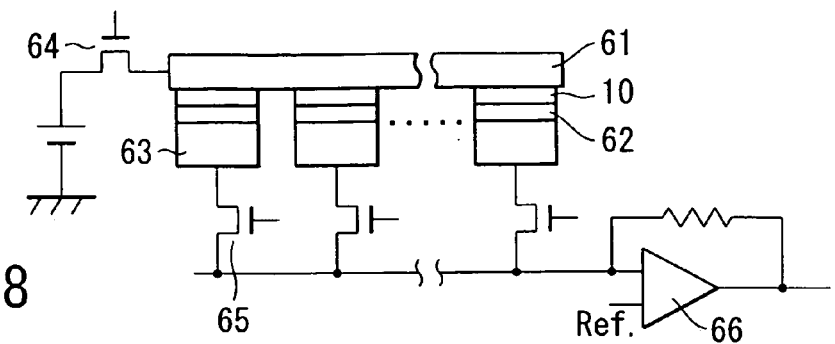
FIG. 18 is a diagram schematically showing the MRAM according to a sixth embodiment of the present invention.

FIG. 18 is a diagram schematically showing the MRAM according to the sixth embodiment of the present invention. In the MRAM shown in FIG. 18, one end of the TMR element 10 is connected to a reading/writing bit line 61. The other end of the TMR element 10 is connected to a reading/writing word line 63 via a diode 62. Additionally, the bit line 61 and word line 63 are arranged to intersect each other.

During the reading, the bit line 61 and word line 63 connected to any one of the TMR elements 10 are selected by transistors 64 and 65, and a sense amplifier 66 detects a current. Moreover, during the writing, the bit line 61 and word line 63 connected to any one of the TMR elements 19 are selected by the transistors 64 and 65, and a writing current is caused to flow. In this case, a writing magnetic field constituted by synthesizing the magnetic fields generated around the bit line 63 and word line 64 changes the magnetization of the free ferromagnetic layer 2 of the TMR element 10 in a predetermined direction. Thereby, the writing is performed. Additionally, the diode 62 has a function of interrupting a detour current flowing via the non-selected TMR element 19 during the reading or the writing.

A seventh embodiment of the present invention will next be described.

Figure 19:
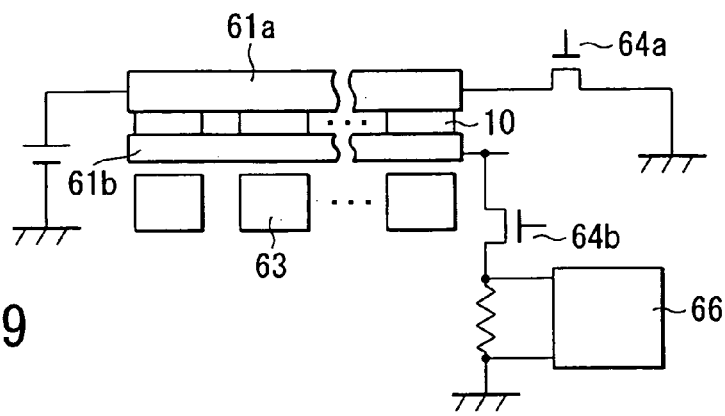
FIG. 19 is a diagram schematically showing the MRAM according to a seventh embodiment of the present invention.

FIG. 19 is a diagram schematically showing the MRAM according to the seventh embodiment of the present invention. The MRAM shown in FIG. 19 has a "ladder type" construction obtained by connecting the TMR elements 10 in parallel between a reading/writing bit line 61a and a reading bit line 61b. Furthermore, the word lines 63 are arranged to intersect the bit lines 61a and 61b in the vicinity of the respective TMR elements 10.

When the writing in the TMR element 10 is performed, a synthesized magnetic field of a magnetic field generated by causing a writing current to flow through the bit line 61a and a magnetic field generated by causing a writing current to flow through the word line 63 is allowed to act on the free ferromagnetic layer 2 of the TMR element 10. On the other hand, during the reading, transistors 64a and 64b select a set of bit lines 61a and 61b, and apply a voltage between the bit lines 61a and 61b. Then, the current flows through all the TMR elements 10 connected in parallel between the lines. A total of the currents is detected by the sense amplifier 66, and a writing current is passed through the word line 63 disposed in the vicinity of any one of the TMR elements 10. Thereby, the magnetization of the free ferromagnetic layer 2 of the TMR element 10 is changed in the predetermined direction. When a current change is detected, the reading of the TMR element 10 can be performed.

That is, when the magnetization direction of the free ferromagnetic layer 2 before rewriting is the same as the magnetization direction after rewriting, the current detected by the sense amplifier 66 does not change. However, when the magnetization direction of the free ferromagnetic layer 2 reverses before and after the rewriting, the current detected by the sense amplifier 66 changes by a magnetoresistance effect. The stored data corresponding to the magnetization direction of the free ferromagnetic layer 2 before the rewriting can be read out. Additionally, this method corresponds to a so-called "destructive read-out" in which the stored data is changed during read-out.

An eighth embodiment of the present invention will next be described.

Figure 20:
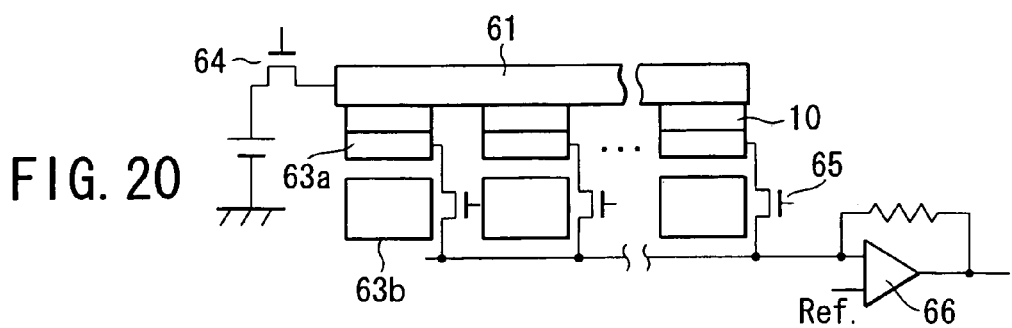
FIG. 20 is a diagram schematically showing the MRAM according to an eighth embodiment of the present invention.

FIG. 20 is a diagram schematically showing the MRAM according to the eighth embodiment of the present invention. In the MRAM shown in FIG. 20, one end of each TMR element 10 is connected in parallel to the reading/writing bit line 61. Moreover, the other end of the TMR element 10 is connected to a reading word line 63a disposed to intersect the bit line 61. Furthermore, a writing word line 63b is disposed in the vicinity of the word line 63a.

When the TMR element 10 is written, the synthesized magnetic field of the magnetic field generated by causing the writing current to flow through the bit line 61 and the magnetic field generated by causing the writing current to flow through the word line 63b is allowed to act on the free ferromagnetic layer 2 of the TMR element 10. On the other hand, during the reading, the transistors 64 and 65 select the bit line 61 and word line 63a connected to any one of the TMR elements 10, and a sense current is further caused to flow through the TMR element 10 and detected by the sense amplifier 66.

A ninth embodiment of the present invention will next be described.

Figure 21:
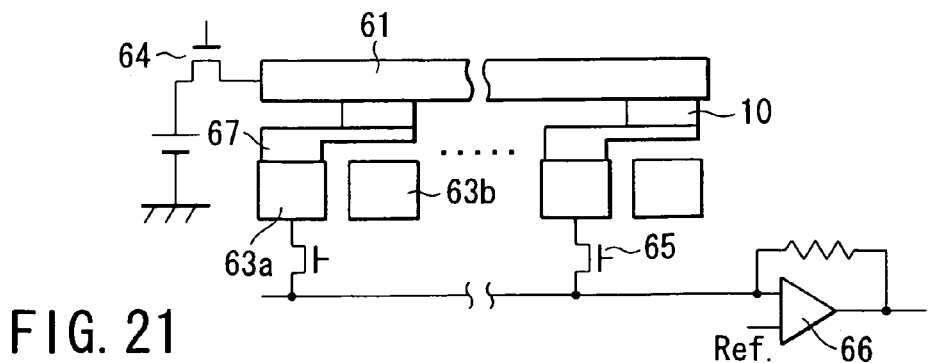
FIG. 21 is a diagram schematically showing the MRAM according to a ninth embodiment of the present invention.

FIG. 21 is a diagram schematically showing the MRAM according to a ninth embodiment of the present invention. In the MRAM shown in FIG. 21, one end of each TMR element 10 is connected in parallel to the reading/writing bit line 61. Moreover, the other end of each TMR element 10 is connected to the reading word line 63a disposed to intersect the bit line 61 via a lead 67. Furthermore, the writing word line 63b is disposed under the TMR element 19.

In the MRAM shown in FIG. 21, the writing and reading can be performed by a method similar to that of the MRAM shown in FIG. 20. Additionally, in the MRAM shown in FIG. 21, different from the MRAM shown in FIG. 20, the word line 63a is not disposed between the word line 63b and the TMR element 10. Therefore, in the MRAM shown in FIG. 21, as compared with the MRAM shown in FIG. 20, the TMR element 10 can be brought closer to the word line 63b. Therefore, the writing magnetic field generated by the word line 63b can effectively be allowed to act on the TMR element 10.

In the fourth to ninth embodiments, the structure in which one memory cell includes one TMR element 10 has been described. In the following tenth and eleventh embodiments, one memory cell is composed of a plurality of TMR elements and a differential amplification reading is performed.

FIGS. 22A and 22B are sectional views schematically showing the MRAM according to a tenth embodiment of the present invention. Additionally, FIG. 22B shows a section taken along line 22B—22B.

In the MRAM shown in FIGS. 22A and 22B, word lines $73a_1$ and $73b_1$ are arranged to intersect a bit line 71. Moreover, word lines $73a_2$ and $73b_2$ are arranged to intersect the bit line 71. Respective TMR elements 10-1 and 10-2 are disposed between the bit line 71 and the word line $73a_1$, and between the bit line 71 and the word line $73a_2$, respectively. One end of each of the TMR elements 10-1 and 10-2 is connected to the bit line 71, and the other end thereof is connected to the word lines $73a_2$ and $73b_2$ via a lead 77. Additionally, a reference numeral 75 denotes an interlayer insulating film.

During the writing, for example, the writing current is caused to flow through the bit line 71, and currents in a reverse direction or the same direction are caused to flow through the word lines $73a_1$ and $73a_2$. Additionally, during the reading, the sense current is caused to flow through the TMR elements 10-1 and 10-2 via the bit line 71, and the sense amplifier performs a differential amplification. When resistances of the TMR elements 10-1 and 10-2 are equal to each other, three types of values are obtained as results of the differential amplification. On the other hand, when the resistances of the TMR elements 10-1 and 10-2 are different from each other, four types of values are obtained as the results of the differential amplification. Therefore, according to the MRAM of FIGS. 22A and 22B, multi-valued storage is possible. Moreover, when the MRAM of FIGS. 22A and 22B performs binary storage, a larger output signal can be obtained.

In the MRAM shown in FIGS. 22A and 22B, the TMR elements 10-1 and 10-2 are placed one upon another. Therefore, even when a constitution for enabling the differential amplification is used, an area occupied by the memory cell does not increase.

Additionally, the differential amplification is also possible, when another constitution is used. For example, two bit lines for the writing and reading may be provided for each of the TMR elements 10-1 and 10-2. Moreover, the word line does not have to be connected to the TMR elements 10-1 and 10-2.

In the MRAM, it is sufficient that at least one of the TMR elements 10-1 and 10-2 is the TMR element 10 described in the first to third embodiments. For example, one of the TMR elements 10-1 and 10-2 is the TMR element 10 described in the first to third embodiments, and the other element may be a TMR element having another structure such as a ferromagnetic single tunnel junction element. Alternatively, both the TMR elements 10-1 and 10-2 may be the TMR element 10 described in the first to third embodiments.

FIGS. 23A and 23B are sectional views schematically showing the MRAM according to an eleventh embodiment of the present invention. Additionally, FIG. 23B shows a section taken along a line 23B—23B of FIG. 23A.

The MRAM shown in FIGS. 23A and 23B has a structure similar to that of the MRAM shown in FIGS. 22A and 22B except that a magnetic film 78 is disposed besides the bit line 71 and that magnetic films 79-1 and 79-2 are disposed around the word lines $73a_1$ and $73a_2$. When the magnetic films 78, 79-1 and 79-2 are disposed, the power consumption can be reduced.

Since the TMR element 10 according to the first to third embodiments is used in the fourth to eleventh embodiments, it is possible both to obtain the large output signal and to suppress the dispersion of the voltage-resistance property.

Therefore, according to the fourth to eleventh embodiments, a large-capacity (e.g., 256 Mbits or more) MRAM can be realized.

In the fourth to eleventh embodiments, the TMR element according to the first to third embodiments is applied to the MRAM. In the following twelfth embodiment, the TMR element according to the first to third embodiments is used as a magnetic head.

Figure 24:
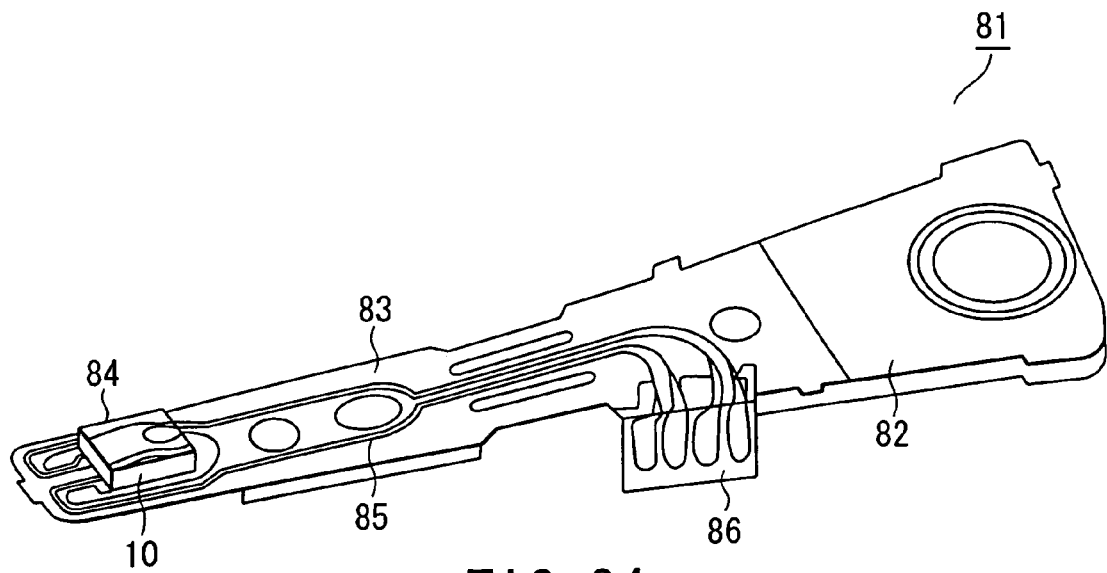
FIG. 24 is a perspective view schematically showing a magnetic head assembly according to a twelfth embodiment of the present invention.

FIG. 24 is a perspective view schematically showing a magnetic head assembly according to a twelfth embodiment of the present invention. A magnetic head assembly 81 shown in FIG. 24 has, for example, an actuator arm 82 including a bobbin section for holding a driving coil. One end of a suspension 83 is attached to the actuator arm 82, and a head slider 84 is attached to the other end of the suspension 83. The TMR element 10 according to the first to third embodiments is incorporated in the head slider 84 and used as a magnetic reproduction head.

A lead wire 85 for writing and reading the signal is formed on the suspension 83, and the lead wires 85 are electrically connected to respective electrodes of the magnetic reproduction head incorporated in the head slider 84. Additionally, a reference numeral 86 denotes an electrode pad of the magnetic head assembly 81.

The magnetic head assembly 81 can be mounted, for example, on a magnetic recording/reproducing apparatus described hereinafter.

Figure 25:
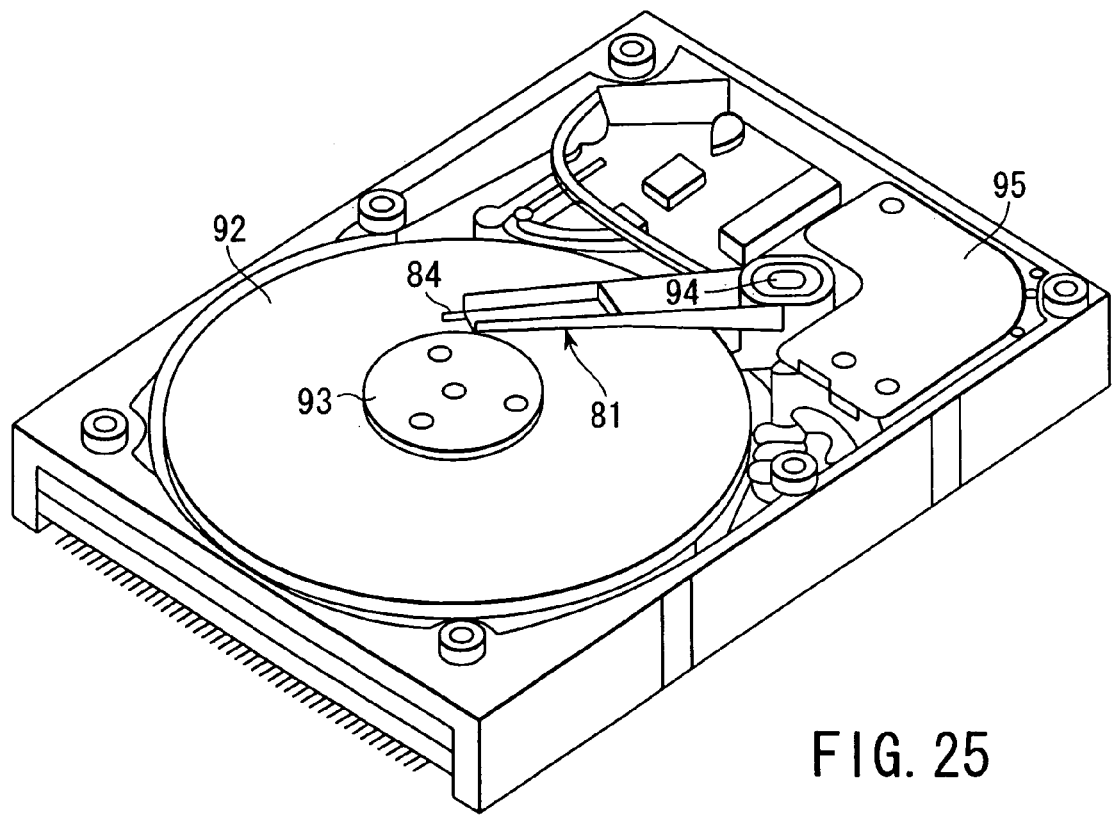
FIG. 25 is a perspective view schematically showing a magnetic recording/reproducing apparatus on which the magnetic head assembly shown in FIG. 24 is mounted.

FIG. 25 is a perspective view schematically showing a magnetic recording/reproducing apparatus on which the magnetic head assembly 81 shown in FIG. 24 is mounted. In the magnetic recording/reproducing apparatus shown in FIG. 25, a magnetic disk 92 as a magnetic recording medium is rotatably supported by a spindle 93. The spindle 93 is connected to a motor (not shown) which operates in response to a control signal from a controller (not shown), and thereby the rotation of the magnetic disk 92 can be controlled.

A fixed shaft 94 is disposed in the vicinity of a circumferential portion of the magnetic disk 92, and the fixed shaft 94 swingably supports the magnetic head assembly 81 shown in FIG. 24 via upper and lower ball bearings (not shown). A coil (not shown) is wound around the bobbin portion of the magnetic head assembly 81, the coil, a permanent magnet, and an opposite yoke disposed opposite to the permanent magnet via the coil form a magnetic circuit and also constitute a voice coil motor 95. The voice coil motor 95 enables the head slider 84 on the tip end of the magnetic head assembly 81 to be positioned on a desired track of the magnetic disk 92. Additionally, in the magnetic recording/reproducing apparatus, the information is recorded and reproduced, while the magnetic disk 92 is rotated, and the head slider 84 floats from the magnetic disk 92.

In the present embodiment, since the TMR element 10 according to the first to third embodiments is used in the magnetic head, a large output signal is obtained. Therefore, stable operation and enlarged capacity are achieved.

In the fourth to twelfth embodiments, the TMR element according to the first to third embodiments is used in the MRAM, magnetic head, and magnetic recording/reproducing apparatus, but the TMR element according to the first to third embodiments has another use. For example, the TMR element according to the first to third embodiments can also be used in a magnetic sensor, and the like.

In the first to twelfth embodiments, the free ferromagnetic layer 2 of the TMR element 10 does not have to be necessarily rectangular.

FIGS. 26A to 26G are plan views showing examples of plane shapes of the free ferromagnetic layer usable in the TMR element according to the first to twelfth embodiments of the present invention.

For the plane shape of the free ferromagnetic layer 2, as shown in FIG. 26A, a protrusion may be added to one diagonal portion of a rectangular shape. Moreover, the plane shape of the free ferromagnetic layer 2 may be a parallelogram as shown in FIG. 26B, rhomboid as shown in FIG. 26C, elliptical as shown in FIG. 26D, or elongated hexagon as shown in FIG. 26E. Additionally, when the free ferromagnetic layer 2 has the shape shown in FIG. 26A or 26B, the magnetization is curved in both ends of the free ferromagnetic layer 2.

When a length L and width W of the free ferromagnetic layer 2 have a ratio of substantially 1:1, the free ferromagnetic layer 2 preferably has the shape shown in FIG. 26F or 26G. In this case, deterioration of a rectangular ratio of a magnetoresistance effect curve and increase of the switching magnetic field are suppressed, and a high thermal stability can be maintained.

Additionally, when the free ferromagnetic layer 2 is patterned in the shape as shown in FIGS. 26A to 26C and 26E to 26G, a corner portion is actually rounded in many cases. In the first to twelfth embodiments, the corner portions of the free ferromagnetic layer 2 may be rounded. Moreover, the free ferromagnetic layer 2 shaped as shown in FIGS. 26A to 26G can easily be formed by forming a pattern shape of reticule used in a photolithography process into a predetermined shape.

Examples of the present invention will be described hereinafter.

EXAMPLE 1

The following TMR elements [1] to [4] were prepared as the spin-valve type TMR element 10 shown in FIG. 7.

TMR Element [1]

The TMR element [1] is the TMR element according to a first example of the present invention. In the TMR element [1], as materials of the antiferromagnetic layer 4a/pinned ferromagnetic layer 1a/tunnel barrier layer 3a/free ferromagnetic layer 2/tunnel barrier layer 3b/pinned ferromagnetic layer 1b/antiferromagnetic layer 4b, Ir—Mn/$Co_{70}Fe_{30}$/$AlO_x$/$(Co_{70}Fe_{30})_{80}Ni_{20}$/$AlO_x$/$(Co_{70}Fe_{30})_{50}Ni_{50}$/Ir—Mn were used. Additionally, the tunnel barrier layers 3a and 3b were formed by forming and plasma-oxidizing the Al film. Moreover, the tunnel barrier layers 3a and 3b were annealed at 320° C. for one hour, the compositions thereof were homogenized.

TMR Element [2]

The TMR element [2] is a TMR element according to a first comparative example. In the TMR element [2], as the materials of the antiferromagnetic layer 4a/ pinned ferromagnetic layer 1a/tunnel barrier layer 3a/ free ferromagnetic layer 2/tunnel barrier layer 3b/ pinned ferromagnetic layer 1b/antiferromagnetic layer 4b, Ir—Mn/$Co_{70}Fe_{30}$/$AlO_x$/$Co_{70}Fe_{30}$/$AlO_x$/$Co_{70}Fe_{30}$/Ir—Mn were used. Each of the tunnel barrier layers 3a and 3b was formed by successively forming a film of a first Al layer, oxidizing the first Al layer, forming a second Al layer on the oxidized first Al layer, and oxidizing the second Al layer. Moreover, an oxidation condition of the first Al layer is set to be different from that of the second Al layer, and oxygen concentration gradients were generated in the respective tunnel barrier layers 3a and 3b in the thickness direction. Additionally, the oxygen concentration gradients were generated such that the oxygen concentration gradient in the tunnel barrier layer 3a is symmetric with the oxygen concentration gradient in the tunnel barrier layer 3b in the thickness direction. Moreover, $Co_{70}Fe_{30}$ used herein is a material from which a large MR ratio is obtained.

TMR Element [3]

A TMR element [3] is a TMR element according to a second comparative example. In the TMR element [3], as the materials of the antiferromagnetic layer 4a/ pinned ferromagnetic layer 1a/tunnel barrier layer 3a/free ferromagnetic layer 2/tunnel barrier layer 3b/pinned ferromagnetic layer 1b/antiferromagnetic layer 4b, Ir—Mn/$Co_{70}Fe_{30}$/$(AlO_x$/$AlN_x)$/$Co_{70}Fe_{30}$/$(AlN_x$/$AlO_x)$/$(Co_{70}Fe_{30})$/Ir—Mn were used. That is, the TMR element [3] has a structure similar to that of the TMR element [2] except that the two-layers structure of the $AlO_x$ layer and $AlN_x$ layer is used in each of the tunnel barrier layers 3a and 3b, and the $AlN_x$ layer is disposed between the $AlO_x$ layer and the free ferromagnetic layer 2.

TMR Element [4]

A TMR element [4] is a TMR element according to a third comparative example. In the TMR element [4], as the materials of the antiferromagnetic layer 4a/pinned ferromagnetic layer 1a/tunnel barrier layer 3a/free ferromagnetic layer 2/tunnel barrier layer 3b/pinned ferromagnetic layer 1b/antiferromagnetic layer 4b, Ir—Mn/$Co_{70}Fe_{30}$/$AlO_x$/$Co_{70}Fe_{30}$/$AlO_x$/$Co_{70}Fe_{30}$/Ir—Mn were used. Additionally, when the tunnel barrier layers 3a and 3b were formed, the oxidation condition was optimized so that the composition is substantially equal to $Al_2O_3$. Moreover, the oxygen concentrations of the tunnel barrier layers 3a and 3b were homogenized.

Additionally, in the TMR elements [1] to [4], the pinned ferromagnetic layers 1a and 1b, free ferromagnetic layer 2, barrier layers 3a and 3b, and antiferromagnetic layers 4a and 4b have equal thickness. Moreover, each of the TMR elements [1] to [4] was processed into a size of 4 μm×4 μm using photolithography and ion milling.

FIG. 27 is a graph showing the property of the TMR element 10 according to Example 1. In the graph, the abscissa indicates a bias voltage applied to the TMR element 10, and the ordinate indicates the output signal voltage. Additionally, the output signal voltage has a value calculated by dividing a product of the MR ratio and bias voltage by 2. Moreover, respective curves 101 to 104 show data obtained with respect to the TMR elements [1] to [4].

As shown in FIG. 27, according to the TMR element [1], a much larger output signal voltage can be obtained on a positive potential side as compared with the TMR elements [2] to [4] which use as a material of pinned ferromagnetic layers 1a and 1b $Co_{70}Fe_{30}$ from which the larger MR ratio is obtained.

Moreover, a large number of TMR elements 10 were formed on the substrate, the bias voltage was set to 400 mV, and the dispersion of the MR ratio was checked. As a result, the dispersions of the MR ratio were ±12.5% and ±10.7% with respect to the TMR elements [2] and [3], and ±3.9% with respect to the TMR element [1].

That is, for the TMR element [1], as compared with the TMR elements [2] and [3], the output signal voltage is high and the dispersion of the MR ratio is suppressed.

EXAMPLE 2

The following TMR elements [5] to [7] were prepared as the spin-valve type TMR element 10 shown in FIG. 7.

TMR Element [5]

The TMR element [5] is a TMR element according to a second example of the present invention. In the TMR element [5], as the materials of the antiferromagnetic layer 4a/pinned ferromagnetic layer 1a/tunnel barrier layer 3a/free ferromagnetic layer 2/tunnel barrier layer 3b/pinned ferromagnetic layer 1b/ antiferromagnetic layer 4b, Ir—Mn/ $Co_{70}Fe_{30}$/$AlO_x$/$Co_{70}Fe_{30}$/$GaO_x$/$Co_{70}Fe_{30}$/Ir—Mn were used. Additionally, the tunnel barrier layers 3a and 3b were formed by forming and plasma-oxidizing the metal film. Moreover, the tunnel barrier layers 3a and 3b were annealed at 320° C. for one hour, the compositions thereof were homogenized.

TMR Element [6]

The TMR element [6] is a TMR element according to a third example of the present invention. In the TMR element [6], as the materials of the antiferromagnetic layer 4a/pinned ferromagnetic layer 1a/tunnel barrier layer 3a/free ferromagnetic layer 2/tunnel barrier layer 3b/pinned ferromagnetic layer 1b/ antiferromagnetic layer 4b, Ir—Mn/ $Co_{70}Fe_{30}$/$AlO_xN_y$/$(Co_{70}Fe_{30})_{70}Ni_{30}$/$AlO_x$/$Co_{70}Fe_{30}$/Ir—Mn were used. Additionally, the tunnel barrier layer 3a was formed by forming and plasma-oxidizing the Al film. On the other hand, the tunnel barrier layer 3b was formed by forming the Al film, and generating a plasma in an atmosphere containing oxygen and nitrogen gases. Here, the layers were annealed at 320° C. for one hour, and the respective compositions of the tunnel barrier layers 3a and 3b were homogenized.

TMR Element [7]

A TMR element [7] is a TMR element according to a fourth comparative example. In the TMR element [7], as the materials of the antiferromagnetic layer 4a/pinned ferromagnetic layer 1a/tunnel barrier layer 3a/free ferromagnetic layer 2/tunnel barrier layer 3b/pinned ferromagnetic layer 1b/antiferromagnetic layer 4b, Ir—Mn/$Co_{70}Fe_{30}$/<$AlO_x$/ $AlN_x$>/$Co_{70}Fe_{30}$/<$AlN_x$/$AlO_x$>/$Co_{70}Fe_{30}$/Ir—Mn were used. Additionally, <$AlO_x$/$AlN_x$> and <$AlN_x$/$AlO_x$> indicate that the laminate structure of the $AlO_x$ layer and $AlN_x$ layer is used in each of the tunnel barrier layers 3a and 3b. In the TMR element [7], the compositions of the $AlO_x$ and $AlN_x$ layers are equal to each other between the tunnel barrier layers 3a and 3b. Moreover, in the TMR element [7], the compositions of the $AlO_x$ and $AlN_x$ layers were homogenized.

TMR Element [8]

A TMR element [8] is a TMR element according to a fifth comparative example. In the TMR element [8], as the materials of the antiferromagnetic layer 4a/pinned ferromagnetic layer 1a/tunnel barrier layer 3a/free ferromagnetic layer 2/tunnel barrier layer 3b/pinned ferromagnetic layer 1b/antiferromagnetic layer 4b, Ir—Mn/$Co_{70}Fe_{30}$/$AlO_x$/ $(Co_{70}Fe_{30})_{70}Ni_{30}$/$AlO_x$/$Co_{70}Fe_{30}$/Ir—Mn were used. Additionally, in the TMR element [8], the composition of the tunnel barrier layer 3a is equal to the composition of the tunnel barrier layer 3b. Moreover, in the TMR element [8], the compositions of the tunnel barrier layers 3a and 3b were homogenized.

Additionally, in the TMR elements [5] to [8], the pinned ferromagnetic layers 1a and 1b, free ferromagnetic layer 2, barrier layers 3a and 3b, and antiferromagnetic layers 4a and 4b have equal thickness. Moreover, each of the TMR elements [5] to [8] was processed into the size of 4 μm×4 μm using the photolithography and ion milling.

Figure 28:
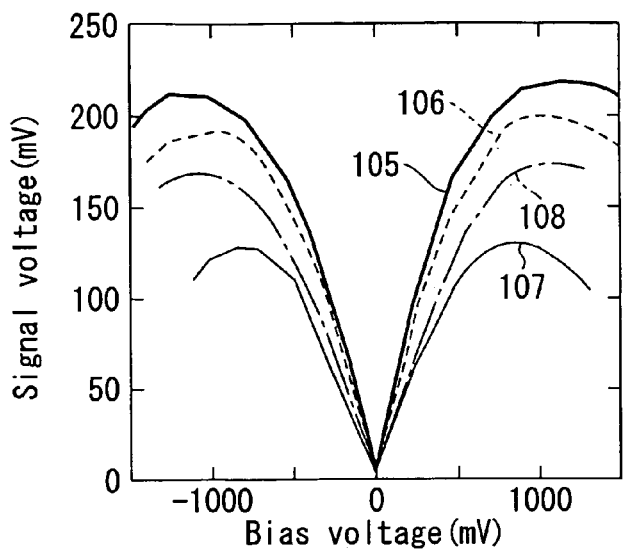
FIG. 28 is a graph showing the property of the TMR element according to Example 2.

FIG. 28 is a graph showing the property of the TMR element 10 according to Example 2. In the graph, the abscissa indicates the bias voltage applied to the TMR element 10, and the ordinate indicates the output signal voltage. Additionally, respective curves 105 to 108 show data obtained with respect to the TMR elements [5] to [8].

As shown in FIG. 28, according to the TMR elements [5] and [6], much larger output signal voltages can be obtained on the positive potential side as compared with the TMR elements [7] and [8].

Moreover, a large number of TMR elements 10 were formed on the substrate, the bias voltage was set to 400 mV, and the dispersion of the MR ratio was checked. As a result, the dispersions of the MR ratio were ±11.5% with respect to the TMR element [8], but ±4.2% with respect to the TMR elements [5] and [6].

That is, for the TMR elements [5] and [6], as compared with the TMR elements [7] and [8], the output signal voltage is high and the dispersion of the MR ratio is suppressed.

EXAMPLE 3

As the spin-valve type TMR element 10 shown in FIG. 7, TMR elements [9] to [15] were prepared. In the following table, the materials used in the TMR elements [9] to [15] are shown. Additionally, in the following table, "PFA" and "PFB" denote the pinned ferromagnetic layers 1a and 1b, "FF" denotes the free ferromagnetic layer, "TBA" and "TBB" denote the tunnel barrier layers 3a and 3b, and "AFA" and "AFB" denote the antiferromagnetic layers 4a and 4b.

TABLE 1

| TMR element | AFA | PFA | TBA | FF | TBB | PFB | AFA |
|---|---|---|---|---|---|---|---|
| [9] | Ir—Mn | $(Co_{70}Fe_{30})_{80}Ni_{20}$ | $AlO_x$ | $(Co_{70}Fe_{30})_{80}Ni_{20}$ | $AlO_x$ | $Co_{70}Fe_{30}$ | Ir—Mn |
| [10] | Ir—Mn | $(Co_{70}Fe_{30})_{60}Ni_{40}$ | $AlO_x$ | $(Co_{70}Fe_{30})_{80}Ni_{20}$ | $AlO_x$ | $(Co_{70}Fe_{30})_{80}Ni_{20}$ | Ir—Mn |
| [11] | Ir—Mn | $(Co_{70}Fe_{30})_{70}Ni_{30}$ | $AlO_x$ | $(Co_{70}Fe_{30})_{60}Ni_{40}$ | $AlO_x$ | $(Co_{70}Fe_{30})_{90}Ni_{10}$ | Ir—Mn |
| [12] | Ir—Mn | $(Co_{70}Fe_{30})_{60}Ni_{40}$ | $AlO_x$ | $(Co_{70}Fe_{30})_{80}Ni_{20}$ | $G_aO_x$ | $Co_{70}Fe_{30}$ | Ir—Mn |
| [13] | Ir—Mn | $(Co_{70}Fe_{30})_{60}Ni_{40}$ | $AlO_x$ | $(Co_{70}Fe_{30})_{80}Ni_{20}$ | $G_aO_x$ | $(Co_{70}Fe_{30})_{80}Ni_{20}$ | Ir—Mn |

TABLE 1-continued

| TMR element | AFA | PFA | TBA | FF | TBB | PFB | AFA |
|---|---|---|---|---|---|---|---|
| [14] | Ir—Mn | $(Co_{70}Fe_{30})_{60}Ni_{40}$ | $AlO_x$ | $(Co_{70}Fe_{30})_{60}Ni_{40}$ | $G_aO_x$ | $Co_{70}Fe_{30}$ | Ir—Mn |
| [15] | Ir—Mn | $(Co_{70}Fe_{30})_{75}Ni_{25}$ | $AlO_x$ | $Co_{70}Fe_{30}$ | $G_aO_x$ | $(Co_{70}Fe_{30})_{85}Ni_{15}$ | Ir—Mn |

In these TMR elements [9] to [15], the respective compositions of the tunnel barrier layers 3a and 3b were homogenized. Moreover, in the TMR elements [1] to [15], the pinned ferromagnetic layers 1a and 1b, free ferromagnetic layer 2, barrier layers 3a and 3b, and antiferromagnetic layers 4a and 4b have equal thickness. Furthermore, each of the TMR elements [9] to [15] was processed into the size of 4 μm×4 μm using the photolithography and ion milling.

Figure 29A:
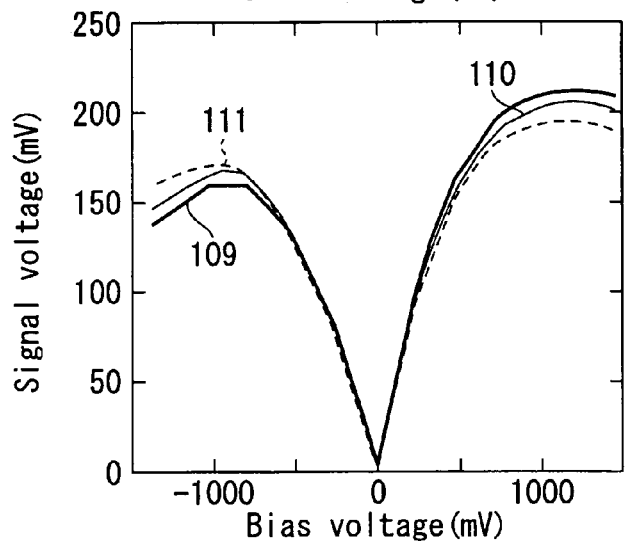
FIGS. 29A and 29B are graphs showing the property of the TMR element according to Example 3.
Figure 29B:
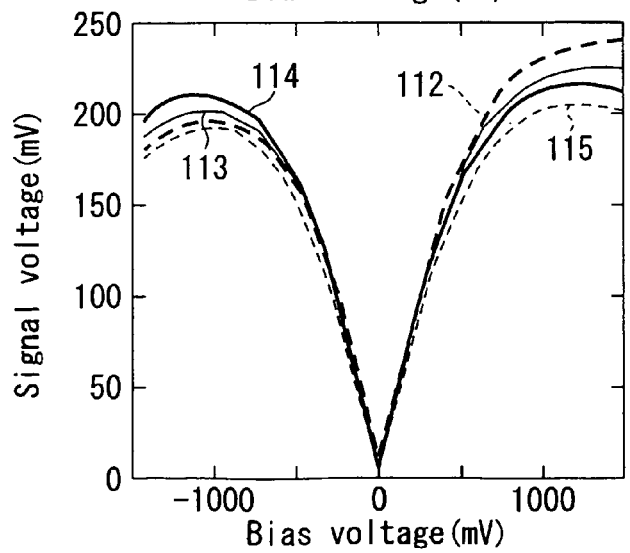

FIGS. 29A and 29B are graphs showing the property of the TMR element 10 according to Example 3. In the graph, the abscissa indicates the bias voltage applied to the TMR element 10, and the ordinate indicates the output signal voltage. Additionally, respective curves 109 to 115 show data obtained with respect to the TMR elements [9] to [15].

As shown in FIGS. 29A and 29B, according to the TMR elements [9] to [15], much larger output signal voltages can be obtained on the positive potential side.

Moreover, a large number of TMR elements 10 were formed on the substrate, the bias voltage was set to 400 mV, and the dispersion of the MR ratio was checked. As a result, the dispersion of the MR ratio was within ±3.8% with respect to the TMR elements [9] to [15].

That is, for the TMR elements [9] and [15], the output signal voltage is high and the dispersion of the MR ratio is suppressed.

As described above, according to the present invention, it is possible both to raise the output signal voltage and to suppress the dispersion of the MR ratio. Therefore, according to the present invention, for example, it is possible to realize the large-capacity MRAM, magnetic reproducer, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetoresistance effect element comprising:
   a first pinned ferromagnetic layer;
   a second pinned ferromagnetic layer facing the first pinned ferromagnetic layer;
   a free ferromagnetic layer intervening between the first and second pinned ferromagnetic layers;
   a first tunnel barrier layer intervening between the first pinned ferromagnetic layer and the free ferromagnetic layer; and
   a second tunnel barrier layer intervening between the second pinned ferromagnetic layer and the free ferromagnetic layer,
   wherein the first and second tunnel barrier layers are different from each other in composition.

2. A magnetoresistance effect element according to claim 1, wherein the first and second tunnel barrier layers are different from each other in contained element.

3. A magnetoresistance effect element according to claim 1, further comprising:
   an antiferromagnetic layer provided on at least one of outer surfaces of the first and second pinned ferromagnetic layers.

4. A magnetoresistance effect element according to claim 1, wherein at least one of the first and second pinned ferromagnetic layers and the free ferromagnetic layer includes ferromagnetic layers and a nonmagnetic metal layer intervening between the ferromagnetic layers.

5. A magnetic random access memory comprising:
   word lines;
   bit lines intersecting the word lines; and
   memory cells each positioned in each of intersection regions of the word lines and the bit lines and each including a magnetoresistance effect element, the magnetoresistance effect element including:
   a first pinned ferromagnetic layer,
   a second pinned ferromagnetic layer facing the first pinned ferromagnetic layer,
   a free ferromagnetic layer intervening between the first and second pinned ferromagnetic layers,
   a first tunnel barrier layer intervening between the first pinned ferromagnetic layer and the free ferromagnetic layer, and
   a second tunnel barrier layer intervening between the second pinned ferromagnetic layer and the free ferromagnetic layer,
   wherein the first and second tunnel barrier layers are different from each other in composition.

6. A magnetic random access memory according to claim 5, wherein each memory cell further comprises a switching element.

7. A magnetic random access memory according to claim 5, wherein the first and second tunnel barrier layers are different from each other in contained element.

8. A magnetic head comprising:
   a support member; and
   a magnetoresistance effect element supported by the support member, the magnetoresistance effect element including:
   a first pinned ferromagnetic layer,
   a second pinned ferromagnetic layer facing the first pinned ferromagnetic layer,
   a free ferromagnetic layer intervening between the first and second pinned ferromagnetic layers,
   a first tunnel barrier layer intervening between the first pinned ferromagnetic layer and the free ferromagnetic layer, and
   a second tunnel barrier layer intervening between the second pinned ferromagnetic layer and the free ferromagnetic layer,
   wherein the first and second tunnel barrier layers are different from each other in composition.

9. A magnetic head according to claim 8, wherein the first and second tunnel barrier layers are different from each other in contained element.

10. A magnetoresistance effect element comprising:
a first pinned ferromagnetic layer;
a second pinned ferromagnetic layer facing the first pinned ferromagnetic layer;
a free ferromagnetic layer intervening between the first and second pinned ferromagnetic layers;
a first tunnel barrier layer intervening between the first pinned ferromagnetic layer and the free ferromagnetic layer; and
a second tunnel barrier layer intervening between the second pinned ferromagnetic layer and the free ferromagnetic layer,
wherein the first and second tunnel barrier layers contain at least one material selected from the group consisting of $Al_2O_3$, $SiO_2$, $MgO$, $AlN$, $AlON$, $GaO$, $Bi_2O_3$, $SrTiO_2$ and $AlLaO_3$, and the material contained in the first tunnel barrier layer and the material contained in the second tunnel barrier layer are different from each other.

11. A magnetoresistance effect element according to claim 10, wherein at least one of the free ferromagnetic layer and the first and second pinned ferromagnetic layers includes a pair of ferromagnetic layers and a nonmagnetic metal layer intervening therebetween.

12. A magnetoresistance effect element according to claim 11, wherein the free ferromagnetic layer includes the pair of ferromagnetic layers and the nonmagnetic metal layer, and the ferromagnetic layers of the free ferromagnetic layer are ferromagnetically coupled with each other.

13. A magnetoresistance effect element according to claim 11, further comprising:
an antiferromagnetic layer provided on at least one of outer surfaces of the first and second pinned ferromagnetic layers.

14. A magnetic random access memory comprising:
word lines;
bit lines intersecting the word lines; and
memory cells each positioned in each of intersection regions of the word lines and the bit lines and each including the magnetoresistance effect element according to claim 10.

15. A magnetic random access memory according to claim 14, wherein each memory cell further comprises a switching element.

16. A magnetic head comprising:
the magnetoresistance effect element according to claim 10; and
a support member configured to support the magnetoresistance effect element.

17. A magnetic reproducer configured to reproduce data recorded on a magnetic recording medium, comprising:
the magnetic head according to claim 16; and
a moving device configured to move the magnetic head with respect to the magnetic recording medium.

18. A magnetoresistance effect element comprising:
a first ferromagnetic layer as a pinned ferromagnetic layer;
a first tunnel barrier layer formed on the first ferromagnetic layer such that the magnetoresistance effect element exhibits magnetoresistance effect;
a second ferromagnetic layer as a free ferromagnetic layer formed on the first tunnel barrier layer;
a second tunnel barrier layer formed on the second ferromagnetic layer such that the magnetoresistance effect element exhibits magnetoresistance effect; and
a third ferromagnetic layer as a pinned ferromagnetic layer formed on the second tunnel barrier layer,
wherein the second ferromagnetic layer includes a fourth ferromagnetic layer, a nonmagnetic metal layer formed on the fourth ferromagnetic layer, and a fifth ferromagnetic layer formed on the nonmagnetic metal layer, and a material contained in the first tunnel barrier layer and a material contained in the second tunnel barrier layer are different from each other.

19. A magnetoresistance effect element according to claim 18, wherein the fourth and fifth ferromagnetic layers are ferromagnetically coupled with each other.

20. A magnetoresistance effect element according to claim 18, further comprising:
an antiferromagnetic layer provided on at least one of outer surfaces of the first and third ferromagnetic layers.

21. A magnetic random access memory comprising:
word lines;
bit lines intersecting the word lines; and
memory cells each positioned in each of intersection regions of the word lines and the bit lines and each including the magnetoresistance effect element according to claim 18.

22. A magnetic random access memory according to claim 21, wherein each memory cell further comprises a switching element.

23. A magnetic head comprising:
the magnetoresistance effect element according to claim 18; and
a support member configured to support the magnetoresistance effect element.

24. A magnetic reproducer configured to reproduce data recorded on a magnetic recording medium, comprising:
the magnetic head according to claim 23; and
a moving device configured to move the magnetic head with respect to the magnetic recording medium.

* * * * *